(12) United States Patent
Cho et al.

(10) Patent No.: US 11,177,835 B2
(45) Date of Patent: *Nov. 16, 2021

(54) DATA STORAGE DEVICE

(71) Applicant: SK hynix Inc., Gyeonggi-do (KR)

(72) Inventors: Kyoung Lae Cho, Gyeonggi-do (KR);
Naveen Kumar, San Jose, CA (US);
Aman Bhatia, San Jose, CA (US);
Yi-Min Lin, San Jose, CA (US);
Chenrong Xiong, San Jose, CA (US);
Fan Zhang, Fremont, CA (US); Yu Cai, San Jose, CA (US); Abhiram Prabahkar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/549,930

(22) Filed: Aug. 23, 2019

(65) Prior Publication Data

US 2019/0379405 A1    Dec. 12, 2019

Related U.S. Application Data

(63) Continuation-in-part of application No. 16/517,144, filed on Jul. 19, 2019, which is a continuation of
(Continued)

(30) Foreign Application Priority Data

Sep. 25, 2015    (KR) .................. 10-2015-0136362

(51) Int. Cl.
*H03M 13/37*    (2006.01)
*G06F 11/10*    (2006.01)
(Continued)

(52) U.S. Cl.
CPC ........ *H03M 13/3707* (2013.01); *G06F 3/064* (2013.01); *G06F 3/0619* (2013.01);
(Continued)

(58) Field of Classification Search
CPC .................................................. H03M 13/3707
(Continued)

(56) References Cited

U.S. PATENT DOCUMENTS 4,757,478 A    7/1988  Ducourant et al.
4,993,029 A    2/1991  Galbraith et al.
(Continued)

FOREIGN PATENT DOCUMENTS

CN    1622137 A    6/2005
CN    101308706 A    11/2008
(Continued)

OTHER PUBLICATIONS

Ayinala M et al., Efficient Parallel VLSI Architecture for Linear Feedback Shift Registers, 2010, pp. 52-57, IEEE Workshop on Signal Processing Systems.
(Continued)

*Primary Examiner* — Fritz Alphonse
(74) *Attorney, Agent, or Firm* — IP & T Group LLP

(57) ABSTRACT

A data processing system includes a storage medium, and a controller including a data processing block, configured to receive data from a host, transmit the received data to the storage medium, read data from the storage medium in response to a read request from the host, and decode the read data by the data processing block according to multiple decoding modes. The data processing block includes a first decoder and a second decoder, and is configured to manage the first decoder and the second decoder to run the decoding (Continued)

for the read data, and activate a fast decoding having shorter latency than a normal decoding after a fast decoding condition is satisfied.

5 Claims, 23 Drawing Sheets

Related U.S. Application Data application No. 16/138,512, filed on Sep. 21, 2018, now Pat. No. 10,396,827, which is a continuation-in-part of application No. 15/016,443, filed on Feb. 5, 2016, now Pat. No. 10,102,066, application No. 16/549,930, which is a continuation-in-part of application No. 15/607,260, filed on May 26, 2017, now Pat. No. 10,419,024, and a continuation-in-part of application No. 15/674,134, filed on Aug. 10, 2017, now Pat. No. 10,432,363.

(60) Provisional application No. 62/374,692, filed on Aug. 12, 2016.

(51) Int. Cl.
  *G06F 3/06* (2006.01)
  *H03M 13/11* (2006.01)

(52) U.S. Cl.
  CPC .......... *G06F 3/0659* (2013.01); *G06F 3/0679* (2013.01); *G06F 11/1076* (2013.01); *H03M 13/1108* (2013.01); *H03M 13/1111* (2013.01)

(58) Field of Classification Search
  USPC ........................................................ 713/764
  See application file for complete search history.

(56) References Cited

U.S. PATENT DOCUMENTS

| | | | |
|---|---|---|---|
| 6,543,021 B1 | 4/2003 | Piret | |
| 6,711,709 B1 | 3/2004 | York | |
| 7,710,758 B2 | 5/2010 | Jo | |
| 8,095,859 B1 | 1/2012 | Peterson et al. | |
| 8,195,622 B2 | 6/2012 | Albert et al. | |
| 8,332,723 B2 | 12/2012 | Song et al. | |
| 8,443,251 B1 * | 5/2013 | Zhang ............... | H03M 13/6331 714/752 |
| 8,499,217 B2 | 7/2013 | Song et al. | |
| 8,527,718 B2 | 9/2013 | Zwisler et al. | |
| 8,527,720 B2 | 9/2013 | Jess | |
| 8,527,843 B2 | 9/2013 | Ramesh et al. | |
| 8,839,077 B2 | 9/2014 | Ueng et al. | |
| 9,009,567 B2 | 4/2015 | Baptist et al. | |
| 9,081,677 B2 | 7/2015 | Miyata et al. | |
| 9,214,964 B1 | 12/2015 | Varnica et al. | |
| 9,231,623 B1 | 1/2016 | Kumar et al. | |
| 9,495,243 B2 | 11/2016 | Lu et al. | |
| 10,102,066 B2 | 10/2018 | Cho | |
| 10,396,827 B2 | 8/2019 | Cho | |
| 2006/0156189 A1 | 7/2006 | Tomlin | |
| 2007/0033485 A1 | 2/2007 | Cohen et al. | |
| 2007/0043998 A1 | 2/2007 | Lakkis | |
| 2007/0047660 A1 | 3/2007 | Mitani et al. | |
| 2007/0206675 A1 | 9/2007 | Tanaka | |
| 2007/0226593 A1 | 9/2007 | Mead et al. | |
| 2008/0205145 A1 | 8/2008 | Kanno et al. | |
| 2009/0015291 A1 | 1/2009 | Kim et al. | |
| 2009/0177931 A1 | 7/2009 | Song et al. | |
| 2009/0180533 A1 | 7/2009 | Bushell | |
| 2009/0193213 A1 | 7/2009 | Winter | |
| 2009/0276609 A1 | 11/2009 | Moyer et al. | |
| 2010/0088575 A1 | 4/2010 | Sharon et al. | |
| 2013/0132792 A1 * | 5/2013 | Yamaki ............... | G06F 11/1048 714/755 |
| 2013/0254616 A1 * | 9/2013 | Yang ................. | H03M 13/6516 714/752 |
| 2013/0254623 A1 * | 9/2013 | Yang ................. | H03M 13/6516 714/763 |
| 2013/0254639 A1 | 9/2013 | Krishnan et al. | |
| 2013/0265842 A1 * | 10/2013 | Ware .................. | G11C 11/4097 365/230.03 |
| 2013/0276038 A1 | 10/2013 | Kiura | |
| 2014/0068320 A1 | 3/2014 | Vedpathak et al. | |
| 2014/0122962 A1 | 5/2014 | Kodavalla | |
| 2014/0168811 A1 | 6/2014 | Yang et al. | |
| 2015/0095274 A1 | 4/2015 | Lamb | |
| 2015/0169406 A1 | 6/2015 | Li et al. | |
| 2015/0195581 A1 | 7/2015 | Lee et al. | |
| 2015/0279421 A1 | 10/2015 | Wilson et al. | |
| 2015/0301985 A1 | 10/2015 | Zhang et al. | |
| 2015/0312027 A1 | 10/2015 | Kim et al. | |
| 2015/0363263 A1 | 12/2015 | Hassner et al. | |
| 2016/0006459 A1 | 1/2016 | Hanham et al. | |
| 2016/0006462 A1 | 1/2016 | Hanham et al. | |
| 2016/0011939 A1 | 1/2016 | Luby | |
| 2016/0154698 A1 | 6/2016 | Kazi | |
| 2016/0179608 A1 | 6/2016 | Gorobets et al. | |
| 2016/0249234 A1 | 8/2016 | Zhang et al. | |
| 2016/0292426 A1 | 10/2016 | Gibart et al. | |
| 2018/0032396 A1 | 2/2018 | Sharon et al. | |
| 2018/0034477 A1 | 2/2018 | Zamir et al. | |
| 2020/0004677 A1 * | 1/2020 | Firoozshahian .... | G06F 12/1009 |

FOREIGN PATENT DOCUMENTS

| | | |
|---|---|---|
| CN | 101465654 A | 6/2009 |
| CN | 101527844 A | 9/2009 |
| CN | 104768061 A | 7/2015 |
| KR | 10-2011-0067656 A | 6/2011 |
| KR | 10-2012-0095609 A | 8/2012 |
| KR | 1020150017948 | 2/2015 |

OTHER PUBLICATIONS

Wu W.Q. et al., Design of parameterized LFSR modules based on VHDL, Journal of Naval University of Engineering, Jun. 2009, pp. 89-94, vol. 21, No. 3, China Academic Journal Electronic Publishing House.

Office Action issued by the Korea Intellectual Property Office dated Jan. 26, 2021.

Notice of Allowance issued by the USPTO for U.S. Appl. No. 16/517,144 dated Mar. 3, 2021.

Certificate of Invention Patent issued by the CNIPA dated Feb. 19, 2021.

Office Action issued by the Chinese Patent Office dated Aug. 18, 2021.

* cited by examiner

Variable Nodes    Check Nodes

DATA STORAGE DEVICE

CROSS-REFERENCES TO RELATED APPLICATION

This application is a continuation-in-part application of: 1) U.S. patent application Ser. No. 16/517,144 filed on Jul. 19, 2019, which is a continuation application of U.S. patent application Ser. No. 16/138,512 filed on Sep. 21, 2018, which is a continuation-in-part application of U.S. patent application Ser. No. 15/016,443 filed on Feb. 5, 2016 and issued on Oct. 16, 2018 as U.S. Pat. No. 10,102,066, which claims priority to Korean patent application number 10-2015-0136362, filed on Sep. 25, 2015; 2) U.S. patent application Ser. No. 15/607,260 filed on May 26, 2017; and 3) U.S. patent application Ser. No. 15/674,134 filed on Aug. 10, 2017, which claims priority to U.S. Provisional Application No. 62/374,692 filed on Aug. 12, 2016. The disclosure of each of the foregoing applications is herein incorporated by reference in its entirety.

BACKGROUND

1. Technical Field

Various embodiments generally relate to a data processing device and more particularly, to a data processing device having an improved data correction capability.

2. Related Art

Data storage devices store data provided by an external device in response to a write request. The data storage devices may also provide stored data to an external device in response to a read request. Examples of external devices employing one or more data storage devices include computers, digital cameras, cellular phones and the like. The data storage devices may be embedded in the external devices or may be fabricated in a separate form and connected to the external devices to operate.

In NAND flash storage systems, the read reference voltages are used to divide the possible threshold voltage range of NAND flash memory cells to several windows. A logical value is designated to each of the windows. The logical value of a cell is determined by the voltage window which the cell's threshold voltage is located in. For example, for a single-level cell (SLC), one read reference voltage is needed. When the threshold voltage of a cell is less than the specified read reference voltage, the logical value of the cell sets to "1"; otherwise, the cell's logical value sets to "0". For a multi-level cell (MLC), three read reference voltages are used. For a triple level cell (TLC) device, there are seven read reference voltages.

The threshold voltage of a cell can vary from its intended value for various reasons, such as program and read operation of neighboring cells, the number of program/erase cycles, and the retention time. Therefore, it is possible that the threshold voltage of a cell with an intended value shifts into another voltage window with a different logical value. In this case, when the cell is read, a wrong logical value is given and this error will be counted in the raw bit error rate (RBER) measurement. An optimal read reference voltage can achieve the minimal RBER.

Currently, there are two types of algorithm for the error-correction control solution, the hard-decoding algorithm and the soft-decoding algorithm. For the hard-decoding algorithm, the hard information which indicates that the input information is "0" or "1" is used. However, the soft information is used for the soft-decoding algorithm, which not only tells the decoder if the input information is "0" or "1", but also provides the decoder how likely it is "0" of "1". Usually if soft information is provided, a soft-decoding algorithm provides a better error correction performance than a hard-decoding algorithm. In NAND flash storage systems, an error-correction control solution will try the hard decoding first. When the hard decoding fails, the soft-decoding algorithm will be used.

Thus, there remains a need for a memory system and operating method thereof for page health prediction of the memory system.

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used.

Low-density parity-check (LDPC) codes are an example of ECC. Generally, an LDPC decoder uses an iterative decoding process to decode information bits. The iterative decoding consumes time and levies a processing burden. Typically, the time and processing burden increase with an increase to the number of performed iterations. In certain latency sensitive applications (e.g., where the decoding should be completed within a short time period) and/or processing sensitive applications (e.g., where the decoding should use a small amount of processing), existing iterative decoding processes of LDPC codes may not be able to meet the desired latency and/or processing performance.

SUMMARY

Embodiments of the present disclosure are directed to a data processing device capable of performing a decoding operation for correcting errors in data read from a memory device.

Embodiments of the present disclosure are directed to a memory system and an operating method thereof capable of predicting page health of the memory system.

Embodiments of the present disclosure are directed to techniques for improving the latency or processing performance of an error correction system.

In an embodiment, a data processing system includes a storage medium, and a controller including a data processing block, configured to receive data from a host, transmit the received data to the storage medium, read data from the storage medium in response to a read request from the host, and decode the read data by the data processing block according to multiple decoding modes. The data processing block includes a first decoder and a second decoder, and is configured to manage the first decoder and the second decoder to run the decoding for the read data, and activate a fast decoding having shorter latency than a normal decoding after a fast decoding condition is satisfied.

In an example, an operating method of a memory system includes performing a decoding iteration includes conducting NAND read and generating NAND data; decoding in accordance with the NAND data and generating decoder information; predicting a BER in accordance with at least the decoder information; and evaluating the predicted BER and generating evaluation result.

In an example, a system includes an LDPC decoder and initiates an iterative decoding of an LDPC codeword. Generally, the iterative decoding is bounded by a maximum number of iterations. The system determines that a current iteration of the iterative decoding corresponds to number of iterations that is equal to or greater than an iteration number threshold and is smaller than the maximum number of iterations. The system compares a weight of a syndrome of the LDPC codeword at the current number of iterations to a checksum threshold. This comparison may be performed when the syndrome is non-zero. The system terminates the iterative decoding based on the comparing. The iterative decoding is terminated prior to reaching the maximum number of iterations.

DETAILED DESCRIPTION

Figure 1A:
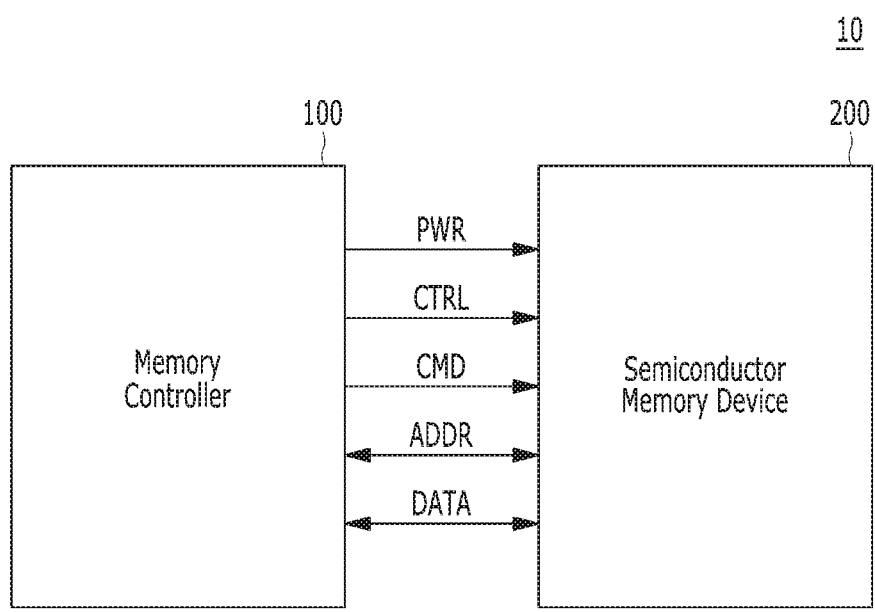
FIG. 1A is a block diagram schematically illustrating a memory system in accordance with an embodiment of the present invention.

Hereinafter, various embodiments of the invention will be described with reference to the accompanying drawings. The invention may, however, be embodied in different forms and should not be construed as being limited to the embodiments set forth herein. Rather, these embodiments are provided so that a person skilled in the art to which the invention pertains could practice the invention.

Moreover, it is to be understood, that embodiments of the invention are not limited to the particulars shown in the drawings, that the drawings are not necessarily to scale and, in some instances, proportions may have been exaggerated in order to more clearly depict certain features of the invention. Also, while particular terminology is used, it is to be appreciated that the terminology used is for describing particular embodiments only and is not intended to limit the scope of the invention.

In NAND flash storage, data can be stored and accessed on a page level basis, and pages can be located in a block belonging to a die. Multiple codewords encoded using error control coding scheme can be stored in a single page. In a random data access command, the data is read out from the page and passed to a decoder. If health of the page, such as bit error rate (BER) for a page, can be predicted, the decoding latency can be avoided and a soft read command can be used to decode data. Sometimes, the page health can be so worse that the data cannot be recovered through even the soft decoding. In that case, chip kill information can be used to decode the data. This page health prediction scheme can not only significantly reduce the error recover flow latency, but also provide other advantages, such as improvement of garbage collection algorithm. In embodiments of current invention disclosure, a novel apparatus and algorithm to predict health of a block using product codes decoder is proposed.

Generalized product codes (GPC) have drawn attention recently for their advantages over state of art error control coding schemes, wherein the current error control coding schemes may have issues such as more noises and long latency, since the schemes wait for decoding failure or completion to take next action. Number of failed constituent codewords with a hard decoder or soft decoder at ith iteration can be used to predict BER for a page. A smaller number of iterations is preferred because the smaller number of iterations can indicate less iterations performed to determine the BER and shorten the decoding time.

The proposed page health predication schemes can track the error decoding process before the decoding failure. The noise data can be used to calculate checksum points, wherein the checksum points can be used to create BER lines. A number of the checksum points can be used to locate BER from the BER lines, more checksum points can result in a more accurate BER prediction. Optionally, multiple codewords can be used to replace the checksum points. For example, from simulations, it is observed that 3 iterations decoder information can provide good BER prediction. Even though the number of failed codewords information used to predict BER, other information from decoder can also be used for prediction before fully decoding.

FIG. 1A is a block diagram schematically illustrating a memory system 10 in accordance with an embodiment of the present invention. Referring FIG. 1A, the memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid-state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a netbook computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 1B:
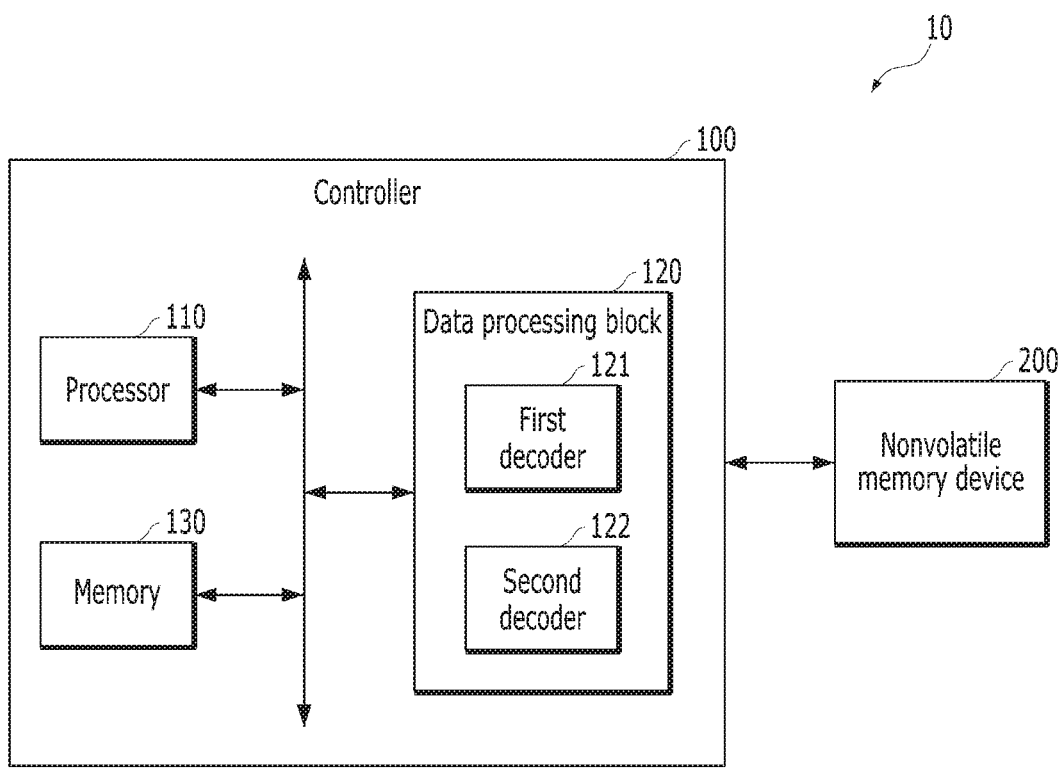
FIG. 1B is a block diagram illustrating a data storage device including a data processing block, according to an embodiment of the invention.

FIG. 1B is a block diagram illustrating a data storage device including a data processing block, according to an embodiment of the invention.

Referring now to FIG. 1B, a data storage device 10 is provided, according to an embodiment of the invention. The data storage device may be any suitable data storage device. For example, the data storage device 10 may be or comprise a personal computer memory card international association (PCMCIA) card, a compact flash (CF) card, a smart media card, a memory stick, a multimedia card (MMC), an embedded MMC (eMMC), a reduced-size multimedia card (RS-MMC), a micro-size version of MMC (MMC-micro), a secure digital (SD) card, a mini secure digital (mini-SD) card, a micro secure digital (micro-SD) card, a universal flash storage (UFS), a solid state drive (SSD), or the like.

The data storage device 10 may include a controller 100 and a nonvolatile memory device 200.

The controller 100 may include a processor 110, a data processing block 120, and a memory 130. The data processing block 120 may include a first decoder 121 and a second decoder 122.

The processor 110 may control the general operations of the data storage device 10. For example, the processor 110 may store data in the nonvolatile memory device 200 in response to a write request transmitted from an external device (not shown). The processor 110 may read data stored in the nonvolatile memory device 200 and output the read data to an external device (not shown) in response to a read request transmitted from the external device.

The processor 110 may control the data processing block 120 to encode data to be stored in the nonvolatile memory device 200 and decode data read from the nonvolatile memory device 200. The processor 110 may control a first decoder 121 of the data processing block 120 to perform a first decoding operation for a plurality of data chunks read sequentially from the nonvolatile memory device 200. The processor 110 may control a second decoder 122 of the data processing block 120 to perform an additional second decoding operation for one or more data chunks selected among the plurality of data chunks for which the first decoding operation failed, in response to a decoding failure report transmitted from the first decoder 121. The first and second decoding operations will be described hereinafter in more detail.

The data processing block 120 may determine whether data read from the nonvolatile memory device 200 includes an error bit, and may correct the error bit.

According to an embodiment, the first decoder 121 may perform a first decoding operation according to an iterative decoding algorithm. According to the first decoding operation, the first decoder 121 may iterate decoding calculations until all error bits included in data are corrected or until a maximum number of iterations has been reached. Decoding calculations may be repeated up to a maximum preset number of times defined by a maximum iteration count. Hence, it is possible, in the case where data include too many error bits, the first decoder 121 may fail in decoding the data even though decoding calculations are iterated to the maximum iteration count. According to an embodiment, the second decoder 122 may also perform a second decoding operation according to an iterative decoding algorithm.

The first decoder 121 and the second decoder 122 may perform decoding in a stepwise manner. For example, the first decoder 121 may perform a first decoding operation for data read from the nonvolatile memory device 200 and then, the second decoder 122 may perform an additional second decoding operation for the data for which the first decoding operation failed. Performing a second decoding operation for only those data for which a first decoding operation failed may reduce the number of errors in the read data while at the same time may reduce the number of iterations, hence improving the overall efficiency of the data processing block 120 and the associated data controller 100 and storage device 10.

The first decoder 121 and the second decoder 122 may perform decoding according to the same or different decoding algorithms. The first decoder 121 and the second decoder 122 may perform decoding according to different decoding algorithms or different decoding schemes. For example, the first decoder 121 may perform decoding in a hard decision decoding scheme according to an LDPC algorithm, and the second decoder 122 may perform decoding in a soft decision decoding scheme according to a low-density parity-check (LDPC) algorithm. The first decoder 121 and the second decoder 122 may have error correction capabilities complementary to each other, by applying different decoding algorithms for data. Accordingly, the error correction capability of the data processing block 120 may be improved.

The first decoder 121 and the second decoder 122 may perform decoding on a predetermined decoding data unit. For example, the first decoder 121 and the second decoder 122 may perform decoding on the basis of a data chunk. The size of each data chunk may be the same or may differ.

The first and second decoders 121, 122 may perform their respective first and second decoding operations on data chunks having the same size. The first and second decoders 121, 122 may perform their respective first and second decoding operations on different size data chunks. In an embodiment, the controller 100 may receive a plurality of data chunks, read sequentially from the nonvolatile memory device 200, and the first and second decoders 121, 122 may perform their respective first and second decoding operations for one or more of the plurality of data chunks.

In an embodiment, the first decoder 121 may perform a normal decoding for one or more data chunks among a plurality of data chunks read sequentially from the nonvolatile memory device 200. Then, based on one or more results of the normal decoding on the one or more data chunks, the first decoder may perform the same or a modified, for example a fast decoding operation for one or more succeeding data chunks. According to an embodiment, the one or more succeeding data chunks may be remaining data chunks for which normal decoding is not yet performed by the first decoder, among the plurality of data chunks. While sequentially performing normal decoding for the plurality of data chunks, the first decoder 121 may determine whether to continue performing normal decoding or perform a modified decoding instead, for example, a fast decoding for one or more of the remaining data chunks, based on a result of normal decoding performed previously. The result of normal decoding may include information on whether normal decoding has succeeded or failed, information on an iteration count of successful normal decoding and/or information on the number of errors corrected in normal decoding. The term "normal" of normal decoding is used to allow normal decoding to be distinguished from a modified decoding e.g. a fast decoding. Normal decoding may be performed according to any suitable conventional method.

In an embodiment, the first decoder 121 may perform fast decoding to more quickly end decoding for a succeeding data chunk. For example, a fast decoding may be used when inefficient decoding for a succeeding data chunk may be expected based on a result of normal decoding performed previously. For example, when it is expected that decoding may fail or a long time may be required even though decoding may succeed, the first decoder 121 may perform a fast decoding for a succeeding one or more data chunks.

According to an embodiment, the first decoder 121 may perform fast decoding for a succeeding data chunk, when normal decoding for a previous data chunk has failed. According to an embodiment, the first decoder 121 may perform fast decoding for a succeeding data chunk, when the number of error bits corrected in normal decoding for a previous data chunk exceeds a threshold number of error bits. According to an embodiment, the first decoder 121 may perform fast decoding for a succeeding data chunk, when an iteration count of successful normal decoding for a previous data chunk, that is, a success iteration count, exceeds a threshold iteration count. According to an embodiment, the first decoder 121 may perform fast decoding for a succeeding data chunk, based on a combination of two or more of the above conditions.

The first decoder 121 may perform fast decoding in various ways. According to an embodiment, the first decoder 121 may perform fast decoding by processing a succeeding data chunk in a bypass mode. When the first decoder 121 is set in the bypass mode, the succeeding data chunk inputted to the first decoder 121 may be outputted as it is. According to an embodiment, the first decoder 121 may perform fast decoding by inserting an error bit in a succeeding data chunk and performing normal decoding for the error-inserted data chunk. According to an embodiment, when the first decoder 121 performs normal decoding within the limit of a first maximum iteration count according to an iterative decoding scheme, the first decoder 121 may perform fast decoding within the limit of a second maximum iteration count smaller than the first maximum iteration count. The second maximum iteration count may be set to, for example, "0" or "1."

According to an embodiment, when performing fast decoding for a succeeding data chunk through the above-described ways, the first decoder 121 may output a result of performing the fast decoding together with its input data chunk, i.e., the succeeding data chunk. For example, when the fast decoding is performed in such a manner that an error bit is inserted in the succeeding data chunk and then normal decoding is performed, the first decoder 121 may separately retain the original succeeding data chunk and output the separately retained original succeeding data chunk together with a fast decoding result. This may allow the second decoder 122 to perform additional decoding with a data chunk transferred from the first decoder 121. It will be described later in detail.

According to an embodiment, when the number of a plurality of data chunks which are sequentially read is smaller than a threshold number of chunks, the first decoder 121 may not perform fast decoding for the plurality of data chunks but the first decoder 121 may continuously perform only normal decoding.

According to an embodiment, the first decoder 121 may transmit a decoding failure report to the processor 110, with respect to a data chunk for which fast decoding is performed. According to an embodiment, the first decoder 121 may transmit identification information for allowing the processor 110 to identify a data chunk for which fast decoding is performed, among a plurality of data chunks. In response to the report from the first decoder 121, the processor 110 may control the second decoder 122 to perform additional decoding for not only a data chunk for which normal decoding has failed in the first decoder 121 but also a data chunk for which fast decoding has been performed in the first decoder 121. It will be described later in detail.

The second decoder 122 may perform additional decoding for data chunks selected among a plurality of data chunks which are sequentially read. The selected data chunks may include a data chunk for which normal decoding has failed in the first decoder 121 and a data chunk for which fast decoding has been performed in the first decoder 121. In order to perform the additional decoding, the first decoder 121 may retain original data chunks and transfer them to the second decoder 122.

While the data processing block 120 of FIG. 1B includes two decoders 121 and 122, it is to be noted that, according to an embodiment, the data processing block 120 may include a plurality of decoders, i.e., three or more decoders. One or more of the plurality of decoders included in the data processing block 120 may perform fast decoding based on a result of normal decoding for a plurality of data chunks which are sequentially read, as described above. The plurality of decoders may perform decoding in a stepwise manner according to respective decoding algorithms different from each other, and may perform additional decoding for data chunks for which decoding has failed in previous decoders.

The memory 130 may serve as a working memory, a cache memory or a buffer memory of the processor 110. The memory 130 as a working memory may store software programs and various program data to be driven by the processor 110. The memory 130 as a cache memory may temporarily store cache data. The memory 130 as a buffer memory may temporarily store data transmitted between the external device and the nonvolatile memory device 200.

The nonvolatile memory device 200 may include flash memory devices such as NAND flash or NOR flash, Ferroelectrics Random Access Memory (FeRAM), Phase-Change Random Access Memory (PCRAM), Magnetoresistive Random Access Memory (MRAM) or Resistive Random Access Memory (ReRAM). The nonvolatile memory device 200 may store data transmitted from the controller 100 and may read stored data and transmit read data to the controller 100, under the control of the controller 100.

While the data storage device 10 of FIG. 1B includes one nonvolatile memory device 200, it is to be noted that the number of nonvolatile memory devices included in the data storage device 10 is not specifically limited.

Figure 2A:
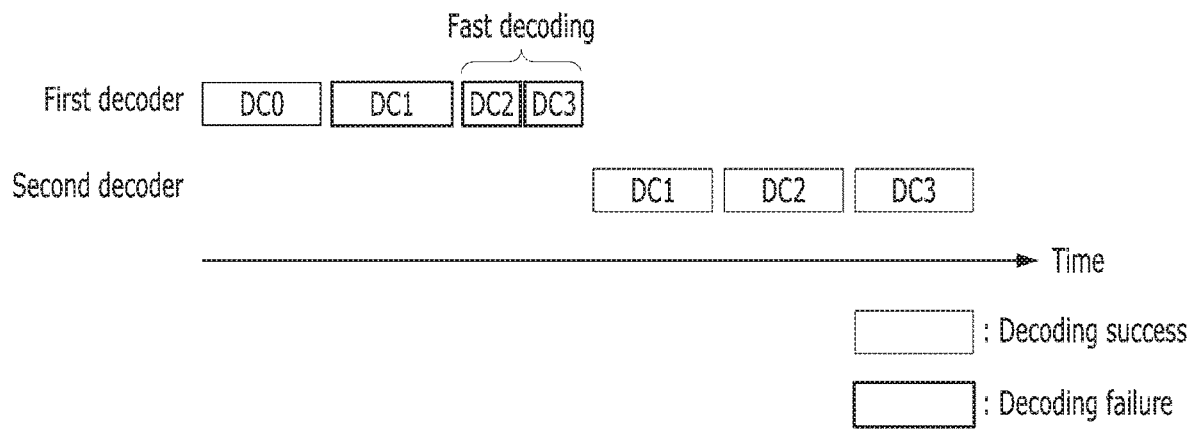
FIGS. 2A and 2B are diagrams illustrating a method for decoding a plurality of data chunks, according to an embodiment of the invention.
Figure 2B:
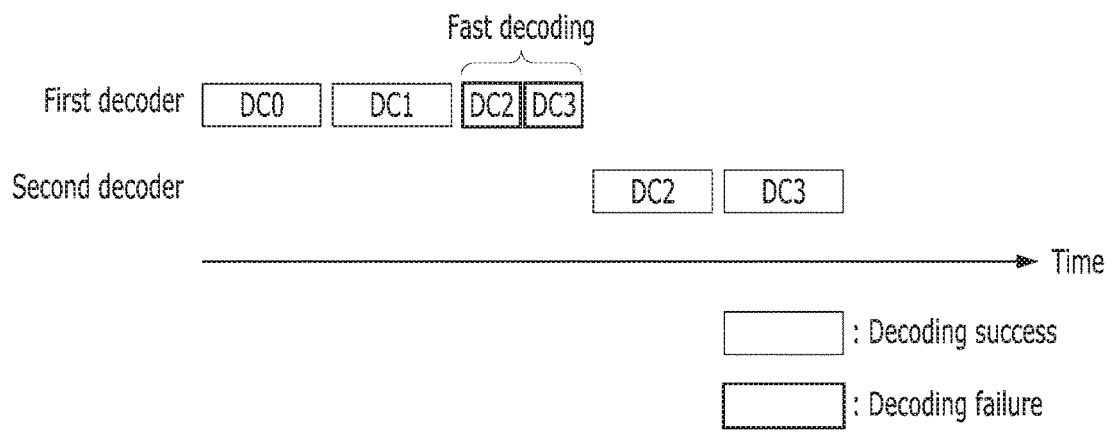

FIGS. 2A and 2B are diagrams illustrating a method for the data processing block 120 of FIG. 1B to decode a plurality of data chunks. In FIGS. 2A and 2B, the data processing block 120 may perform a first decoding for example, for 4 data chunks DC0 to DC3 which are sequentially read.

Referring to FIG. 2A, the first decoder 121 may sequentially process data chunks DC0 to DC3. The first decoder 121 may determine whether to perform a fast decoding for a succeeding data chunk, based on whether normal decoding for a previous data chunk is a success or a failure.

First, the first decoder 121 may perform normal decoding for the first data chunk DC0. When the normal decoding for the first data chunk DC0 is a success, the first decoder 121 may perform normal decoding for the second data chunk DC1. Then, when the normal decoding for the second data chunk DC1 is a failure, the first decoder 121 may perform fast decoding for the succeeding data chunks DC2 and DC3. The first decoder 121 may transmit a decoding failure report to the processor 110, with respect to the second data chunk DC1 for which the normal decoding has failed and the third and fourth data chunks DC2 and DC3 for which the fast decoding has been performed. Meanwhile, according to an embodiment, the first decoder 121 may transmit identification information capable of identifying the third and fourth data chunks DC2 and DC3 for which the fast decoding has been performed, to the processor 110, instead of the decoding failure report.

The second decoder 122 may perform additional decoding for the second data chunk DC1 for which the normal decoding has failed in the first decoder 121 and the third and fourth data chunks DC2 and DC3 for which the fast decoding has been performed in the first decoder 121.

Referring to FIG. 2B, the first decoder 121 may determine whether to perform fast decoding for a succeeding data chunk, based on the number of error bits corrected in normal decoding for a previous data chunk.

First, the first decoder 121 may perform normal decoding for the first data chunk DC0. When the number of error bits corrected in the normal decoding for the first data chunk DC0 does not exceed a threshold number of error bits, the first decoder 121 may also perform normal decoding for the second data chunk DC1. Then, when the number of error bits corrected in the normal decoding for the second data chunk DC1 exceeds the threshold number of error bits, the first decoder 121 may perform fast decoding for the succeeding data chunks DC2 and DC3. The first decoder 121 may transmit a decoding failure report to the processor 110, with respect to the third and fourth data chunks DC2 and DC3 for which the fast decoding has been performed. Meanwhile, according to an embodiment, the first decoder 121 may transmit identification information capable of identifying the third and fourth data chunks DC2 and DC3 for which the fast decoding has been performed, to the processor 110, instead of the decoding failure report.

The second decoder 122 may perform additional decoding for the third and fourth data chunks DC2 and DC3 for which the fast decoding has been performed in the first decoder 121.

According to an embodiment, the first decoder 121 may determine whether to perform fast decoding for a succeeding data chunk, based on a success iteration count of normal decoding for a previous data chunk.

Figure 3:
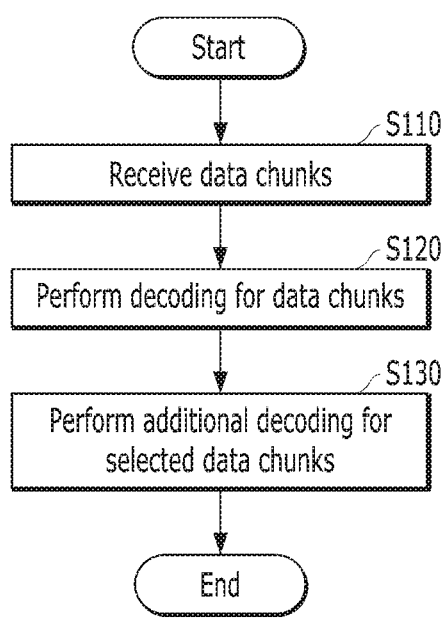
FIG. 3 is a flow chart illustrating a method for operating a data storage device, according to an embodiment of the invention.

FIG. 3 is a flow chart illustrating a method for operating the data storage device 10 of FIG. 1B.

At step S110, the controller 100 may receive a plurality of data chunks which are read sequentially from the nonvolatile memory device 200.

At step S120, the first decoder 121 may perform decoding sequentially for the plurality of data chunks. As aforementioned, the first decoder 121 may perform normal decoding or fast decoding for a succeeding data chunk, based on a result of normal decoding for a previous data chunk. The first decoder 121 may transmit a decoding failure report to the processor 110, with respect to a data chunk for which normal decoding has failed and a data chunk for which fast decoding has been performed.

At step S130, the second decoder 122 may perform additional decoding for data chunks selected among the plurality of data chunks. For example, the second decoder 122 may perform additional decoding for a data chunk for which normal decoding has failed in the first decoder 121 and/or a data chunk for which fast decoding has been performed in the first decoder 121. The second decoder 122 may perform decoding according to a decoding algorithm different from the decoding algorithm employed by the first decoder 121. In an embodiment, the second decoder 122 may perform decoding according to a decoding algorithm that is the same as the decoding algorithm used by the first decoder 121. The decoding algorithm employed by the second decoder 122 may be complimentary to the decoding algorithm employed by the first decoder allowing different data errors to be corrected.

Figure 4:
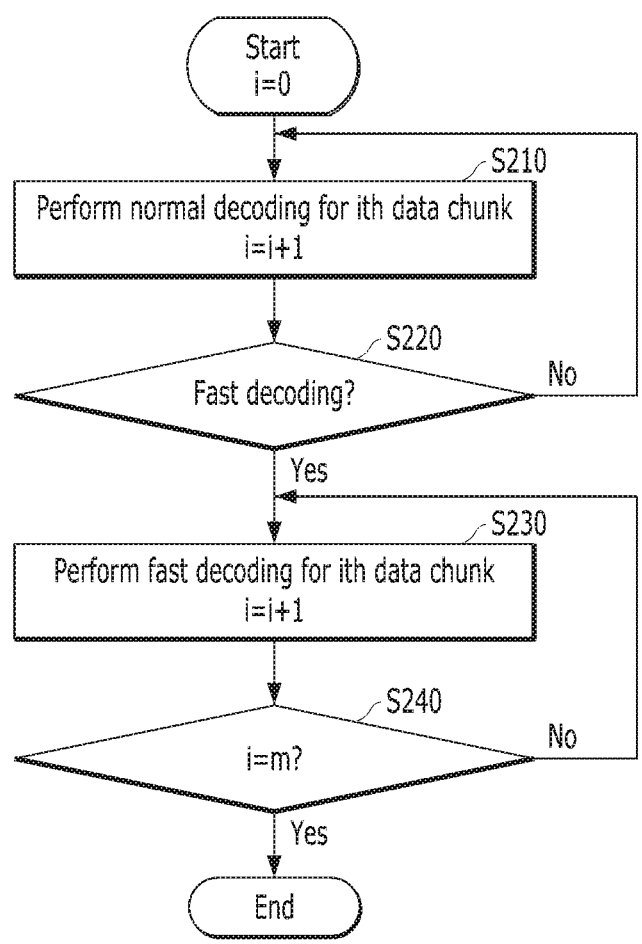
FIG. 4 is a flow chart illustrating a method for decoding one or more data chunks read sequentially, performed by a first decoder of a data processing device, according to an embodiment of the invention.

FIG. 4 is a flow chart illustrating a method for decoding a plurality of data chunks which are read sequentially from a nonvolatile memory device 200. The method may be performed by a first decoder 121 a data processing block as the one shown in FIG. 1B. For example, index i shown in FIG. 4 may be "0" and m may be any positive integer.

At step S210, the first decoder 121 may perform normal decoding for an $i^{th}$ data chunk. The index i may be increased by "1."

At step S220, the first decoder 121 may determine whether to perform fast decoding, based on a result of the normal decoding for the $i^{th}$ data chunk. In the case where it is determined that the fast decoding is not to be performed, the process may proceed to the step S210. For example, the first decoder 121 may perform normal decoding for a succeeding data chunk. In the case where it is determined that the fast decoding is to be performed, the process may proceed to step S230. A method for determining whether to perform a fast decoding will be described later in detail with reference to FIGS. 5A to 5C.

At step S230, the first decoder 121 may perform fast decoding for the $i^{th}$ data chunk. For example, the first decoder 121 may perform fast decoding by processing the $i^{th}$ data chunk in a bypass mode. For example, the first decoder 121 may perform the fast decoding by inserting an error bit in the $i^{th}$ data chunk and performing normal decoding for the error-inserted data chunk. For example, when the first decoder 121 performs normal decoding within the limit of a first maximum iteration count according to an iterative decoding scheme, the first decoder 121 may perform fast decoding within the limit of a second maximum iteration count smaller than the first maximum iteration count. The index i may be increased by "1."

At step S240, the first decoder 121 may determine whether decoding has been completed for m number of data chunks. In the case where decoding for the m number of data chunks is not completed, the process may proceed to the step S230. Hence, the first decoder 121 may continuously perform fast decoding for succeeding data chunks. In the case where the decoding for the m number of data chunks is completed, the process may be ended.

Figure 5A:
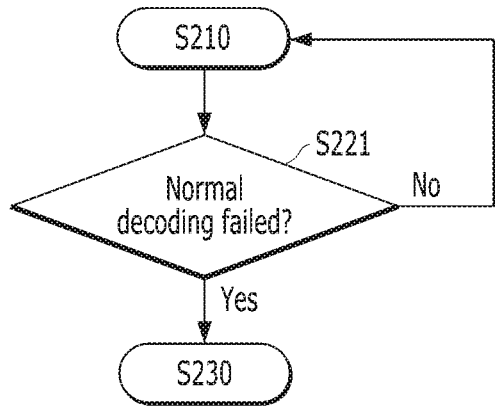
FIGS. 5A to 5C are flow charts illustrating methods performed by a first decoder of a data processing device for determining whether to perform fast decoding for a succeeding data chunk, based on a result of normal decoding for a previous data chunk, according to an embodiment of the invention.
Figure 5B:
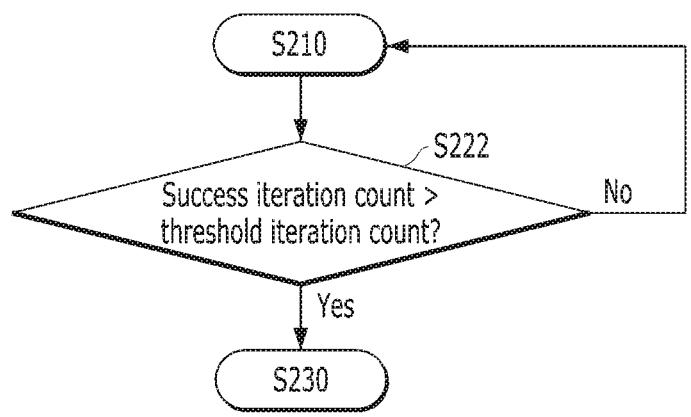
Figure 5C:
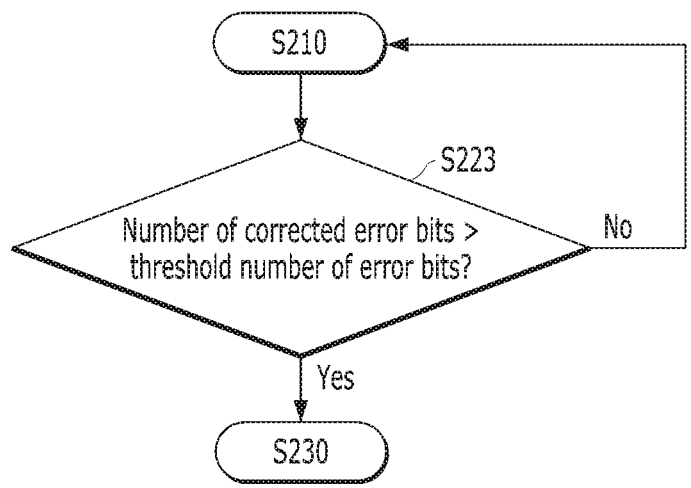

FIGS. 5A to 5C are flow charts illustrating methods performed by the first decoder 121 of FIG. 1B for determining whether to perform fast decoding for a succeeding data chunk, based on a result of normal decoding for a previous data chunk. Steps S221 to S223 may be detailed embodiments of step S220 of FIG. 4. Steps S221 to S223 may be performed between step S210 and step S230 of FIG. 4.

Referring to FIG. 5A, at step S221, the first decoder 121 may determine whether normal decoding for a data chunk is a failure or a success. When the normal decoding for a data chunk is a success, the first decoder 121 may determine to perform normal decoding for a succeeding data chunk, and the process may proceed to the step S210. When the normal decoding for a data chunk is a failure, the first decoder 121 may determine to perform fast decoding for the succeeding data chunk, and the process may proceed to the step S230.

Referring to FIG. 5B, at the step S222, the first decoder 121 may determine whether an iteration count of successful normal decoding for a data chunk, that is, a success iteration count, exceeds a threshold iteration count. When the success iteration count does not exceed the threshold iteration count, the first decoder 121 may determine to perform normal decoding for a succeeding data chunk, and the process may proceed to the step S210. When a success iteration count exceeds the threshold iteration count, the first decoder 121 may determine to perform fast decoding for the succeeding data chunk and the process may proceed to the step S230.

Referring to FIG. 5C, at step S223, the first decoder 121 may determine whether the number of error bits corrected in normal decoding for a data chunk exceeds a threshold number of error bits. When the number of corrected error bits does not exceed the threshold number of error bits, the first decoder 121 may determine to perform normal decoding for a succeeding data chunk and the process may proceed to step S210. When the number of corrected error bits exceeds the threshold number of error bits, the first decoder 121 may determine to perform fast decoding for the succeeding data chunk and the process may proceed to step S230.

Figure 6:
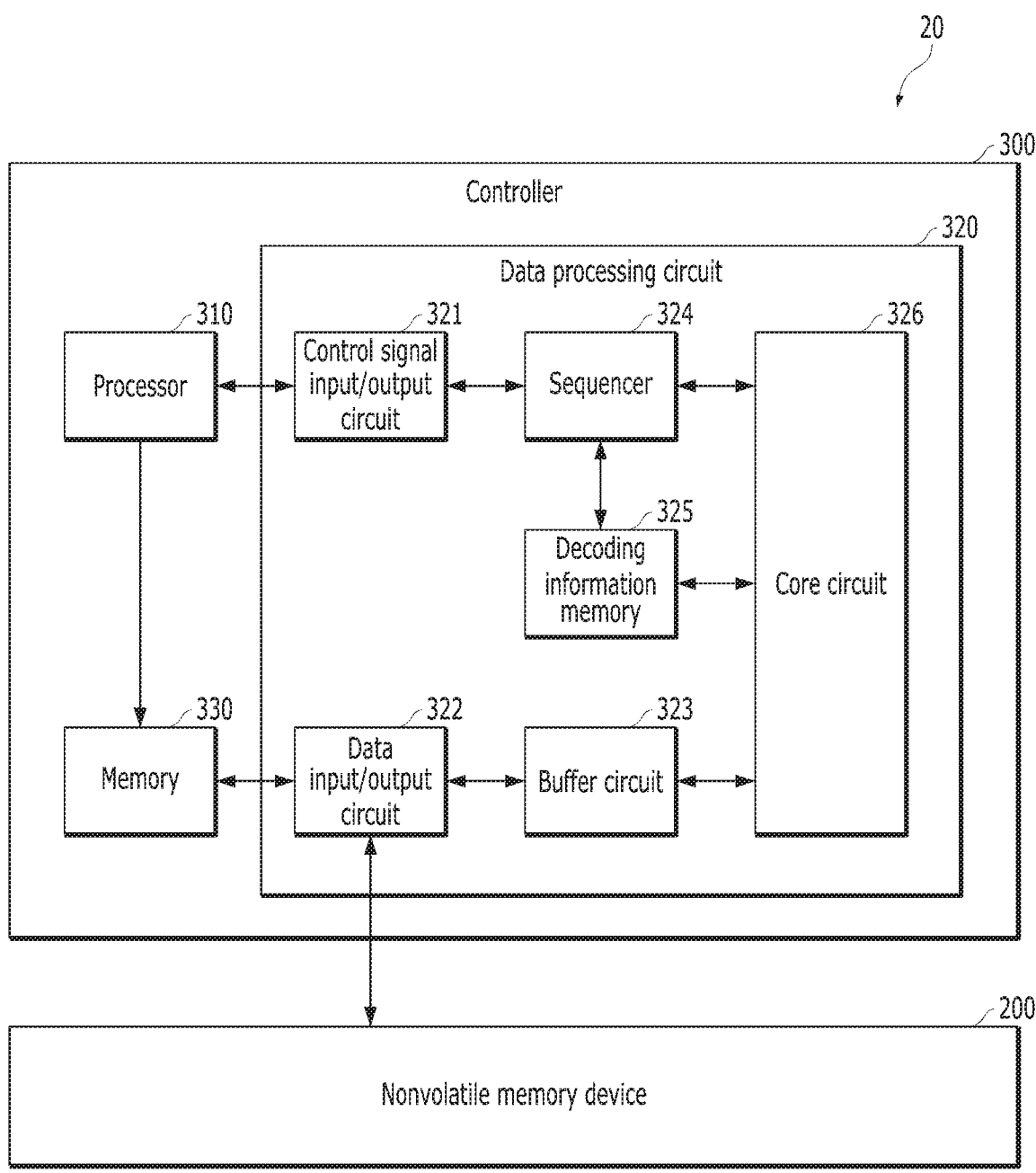
FIG. 6 is a block diagram illustrating a representation of an example of a data storage device 20 in accordance with an embodiment.

FIG. 6 is a block diagram illustrating a representation of an example of a data storage device 20 in accordance with an embodiment.

Referring to FIG. 6, the data storage device 20 may include a controller 300 and a nonvolatile memory device 200.

The controller 300 may include a processor 310, a data processing block 320 and a memory 330.

The processor 310 may control general operations of the data storage device 20. The processor 310 may store data in the nonvolatile memory device 200 in response to a write request transmitted from an external device, and may read data stored in the nonvolatile memory device 200 and output the read data to the external device in response to a read request transmitted from the external device.

The processor 310 may control the data processing block 320 to cause the data processing block 320 to perform decoding on data read from the nonvolatile memory device 200. The processor 310 may control the data processing block 320 by transmitting a control signal to the data processing block 320. The control signal may include an information on the size of data read from the nonvolatile memory device 200, that is, an information on the size of data on which the data processing block 320 is to perform decoding, an information on an address of a memory where data is to be stored, an information on a decoding type, and so forth.

The data processing block 320 may perform decoding on data read from the nonvolatile memory device 200, under the control of the processor 310. In detail, the data processing block 320 may perform decoding on data, by determining whether the data includes an error bit and correcting the error bit. As aforementioned, the data processing block 320 may perform decoding by the unit of data chunk. That is to say, the data processing block 320 may perform decoding, at once, on the bits included in a data chunk.

The data processing block 320 may include a control signal input/output circuit 321, a data input/output circuit 322, a buffer circuit 323, a sequencer 324, a decoding information memory 325 and a core circuit 326.

The control signal input/output circuit 321 may receive the control signal from the processor 310 and transmit a control signal to the sequencer 324. Also, the control signal input/output circuit 321 may transmit informations, for example, a decoding end information, a decoding result information and so fourth, to the processor 310 under the control of the sequencer 324.

The data input/output circuit 322 may receive data from the nonvolatile memory device 200 and transmit the data to the buffer circuit 323. The data input/output circuit 322 may output data stored in the buffer circuit 323, to the memory 330, when decoding on the data stored in the buffer circuit 323 is performed.

The buffer circuit 323 may receive data from the data input/output circuit 322 and store the received data. The buffer circuit 323 may transmit data to the core circuit 326 such that decoding is performed by the core circuit 326. The buffer circuit 323 may receive decoded data from the core circuit 326 and store the received data. In other words, the buffer circuit 323 may temporarily store data decoded/to be decoded by the core circuit 326.

The sequencer 324 may receive the control signal from the control signal input/output circuit 321 and control the internal components of the data processing block 320 based on the control signal. In particular, the sequencer 324 may generate a decoding information to be referred to by the core circuit 326 when performing decoding, based on the control signal. The sequencer 324 may store the decoding information in the decoding information memory 325 which may be accessed by the core circuit 326. According to an embodiment, the sequencer 324 may directly transmit the decoding information to the core circuit 326.

For example, the decoding information may include the information on the size of data read from the nonvolatile memory device 200. For example, the decoding information may include the number of data chunks. The number of data chunks may be determined through dividing the size of data read from the nonvolatile memory device 200 by the size of a data chunk or may be inputted from the processor 310.

According to an embodiment, the decoding information may include a maximum decoding iteration count. The maximum decoding iteration count may be a maximum count by which the core circuit 326 may iteratively perform decoding on a single data chunk.

According to an embodiment, the decoding information may include a decoding type. The decoding type may be for which decoding the core circuit 326 is to perform. The decoding type may include normal decoding, fast decoding and additional decoding.

In detail, first, the sequencer 324 may generate the decoding information such that the core circuit 326 performs normal decoding on a first data chunk among a plurality of data chunks.

When the sequencer 324 receives from the core circuit 326 a report that a fast decoding condition is satisfied, the sequencer 324 may modify the decoding information such that the core circuit 326 performs a fast decoding operation on a second data chunk. An execution time of fast decoding may be shorter than an execution time of normal decoding. The second data chunk may include at least one data chunk which is subsequent to the first data chunk, among the plurality of data chunks. The second data chunk may include at least one data chunk on which normal decoding is not performed yet, among the plurality of data chunks.

When the sequencer 324 receives from the core circuit 326 a report on a result of normal decoding or fast decoding on all the data chunks, the sequencer 324 may modify the decoding information such that the core circuit 326 performs additional decoding on a third data chunk. The third data chunk may include a data chunk on which normal decoding has failed and on which fast decoding has been performed, among the plurality of data chunks. Additional decoding may have better error correction performance and longer execution time than normal decoding.

The decoding information memory 325 may be accessed by the sequencer 324 and the core circuit 326, and may store informations which are to be transmitted between the sequencer 324 and the core circuit 326. For example, the decoding information memory 325 may store the decoding information generated/modified by the sequencer 324, a result determined by the core circuit 326 in terms of whether a fast decoding condition is satisfied, a result of performing decoding on the plurality of data chunks by the core circuit 326, and so forth.

The core circuit 326 may read the decoding information stored in the decoding information memory 325 or receive the decoding information from the sequencer 324. The core circuit 326 may read a data chunk from the buffer circuit 323 based on the decoding information and perform decoding on the data chunk.

In detail, the core circuit 326 may sequentially perform normal decoding on data chunks stored in the buffer circuit 323, when the decoding information of the sequencer 324 instructs normal decoding. At each time of performing normal decoding on a data chunk, the core circuit 326 may determine whether a result of normal decoding satisfies the fast decoding condition.

The result of normal decoding may include at least one among whether normal decoding is a failure, whether the number of error bits corrected in normal decoding exceeds a threshold number even though normal decoding is a success and whether a decoding iteration count in normal decoding exceeds a threshold iteration count. Namely, a case where the fast decoding condition is satisfied may include at least one among a case where normal decoding has failed, a case where the number of error bits corrected in normal decoding exceeds the threshold number and a case where a decoding iteration count in normal decoding exceeds the threshold iteration count.

When the fast decoding condition is satisfied, the core circuit 326 may report through the decoding information memory 325 or directly to the sequencer 324 that the fast decoding condition is satisfied.

When the decoding information of the sequencer 324 instructs fast decoding, the core circuit 326 may perform fast decoding on a subsequent data chunk which is stored in the buffer circuit 323. The core circuit 326 may perform fast decoding on data chunks on which normal decoding is not performed yet, among the data chunks stored in the buffer circuit 323.

Describing in detail a method for the core circuit 326 to perform fast decoding on a data chunk, for example, when the core circuit 326 performs normal decoding based on a first maximum iteration count, the core circuit 326 may perform fast decoding based on a second maximum iteration count smaller than the first maximum iteration count. The first maximum iteration count and the second maximum iteration count may be determined as the decoding information by the sequencer 324.

According to an embodiment, when fast decoding is performed on a data chunk, the data chunk may be outputted to the memory 330 through the data input/output circuit 322 without passing through the core circuit 326. That is to say, the data chunk stored in the buffer circuit 323 may be outputted to the memory 330 by bypassing the core circuit 326.

After performing normal decoding or fast decoding on all the data chunks, the core circuit 326 may report a decoding result through the decoding information memory 325 or directly to the sequencer 324.

When the decoding information of the sequencer 324 instructs additional decoding, the core circuit 326 may perform additional decoding on a data chunk which is selected among the data chunks. The core circuit 326 may perform additional decoding on a data chunk on which normal decoding has failed or a data chunk on which fast decoding has been performed, among the data chunks.

The memory 330 may serve as a working memory, a cache memory or a buffer memory of the processor 310. The memory 330 as a working memory may store software programs and various program data to be driven by the processor 310. The memory 330 as a cache memory may temporarily store cache data. The memory 330 as a buffer memory may temporarily store data to be transmitted between the external device and the data processing block 320. For example, the memory 330 may store data transmitted from the data input/output circuit 322, until it is transmitted to the external device.

According to an embodiment, the buffer circuit 323 may have a smaller capacity, and the memory 330 may have a larger capacity. In this case, the buffer circuit 323 may not be able to store at once all data chunks read from the nonvolatile memory device 200. Therefore, a data chunk on which decoding is performed by the core circuit 326 may be once outputted to the memory 330 without being retained in the buffer circuit 323 for a long time. For example, data on which normal decoding or fast decoding is performed by the core circuit 326 may be outputted to the memory 330 immediately after being stored in the buffer circuit 323. Then, a data chunk on which normal decoding has failed and a data chunk on which fast decoding has been performed, among the data chunks stored in the memory 330, may be transmitted again to the buffer circuit 323 to be applied with additional decoding of the core circuit 326.

Since the nonvolatile memory device 200 is similar to the nonvolatile memory device 200 of FIG. 1B, detailed description thereof will be omitted herein.

Figure 7:
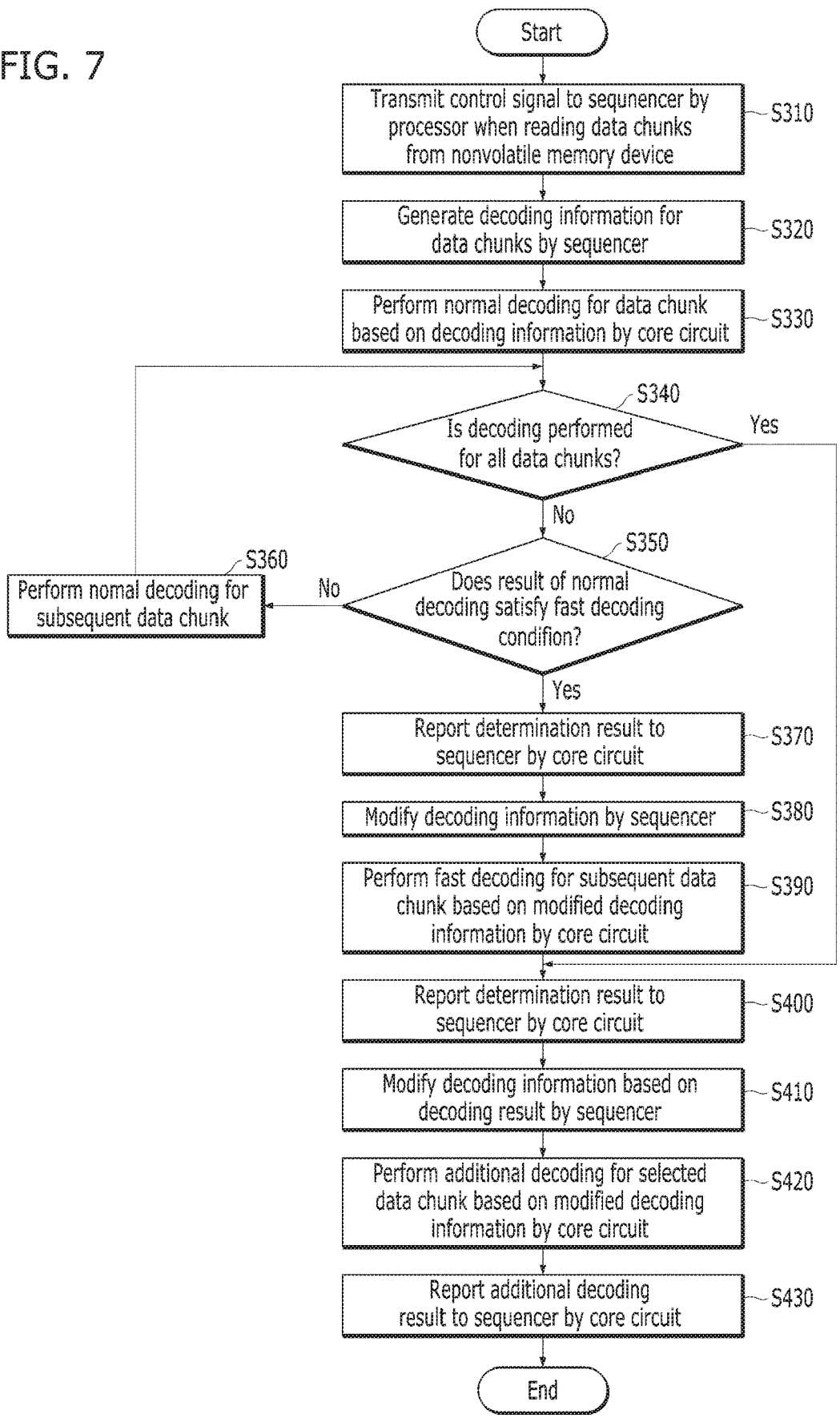
FIG. 7 is a representation of an example of a flow chart to assist in the explanation of a method for operating the data storage device 20 of FIG. 6 in accordance with an embodiment.

FIG. 7 is a representation of an example of a flow chart to assist in the explanation of a method for operating the data storage device 20 of FIG. 6 in accordance with an embodiment.

Referring to FIG. 7, at step S310, when reading data chunks from the nonvolatile memory device 200, the processor 310 may transmit a control signal to the sequencer 324. Data chunks may be read from the nonvolatile memory device 200, be transmitted to the buffer circuit 323 through the data input/output circuit 322 of the data processing block 320, and be stored in the buffer circuit 323. The control signal of the sequencer 324 may include an information on the size of data chunks.

At step S320, the sequencer 324 may generate a decoding information on the data chunks based on the control signal. The decoding information may include the number of all data chunks, a maximum decoding iteration count and a decoding type. At this time, the decoding type may indicate normal decoding. The sequencer 324 may store the decoding information in the decoding information memory 325 or directly transmit the decoding information to the core circuit 326.

At step S330, the core circuit 326 may perform normal decoding on a data chunk which is stored in the buffer circuit 323, based on the decoding information.

At step S340, the core circuit 326 may determine whether decoding has been performed on all data chunks on which decoding is instructed from the sequencer 324. The core circuit 326 may determine whether decoding has been performed on all data chunks, based on the number of data chunks included in the decoding information. When it is determined that decoding has been performed on all data chunks, the process may proceed to step S400. When it is determined that decoding has not been performed on all data chunks, the process may proceed to step S350.

At the step S350, the core circuit 326 may determine whether a result of normal decoding performed immediately before satisfies a fast decoding condition. A case where a result of normal decoding satisfies the fast decoding condition may include at least one among a case where normal decoding has failed, a case where the number of error bits corrected in normal decoding exceeds a threshold number and a case where a decoding iteration count in normal decoding exceeds a threshold iteration count. When it is determined that a result of normal decoding satisfies the fast decoding condition, the process may proceed to step S370. When it determined that a result of normal decoding does not satisfy the fast decoding condition, the process may proceed to step S360.

At the step S360, the core circuit 326 may perform normal decoding on a subsequent data chunk which is stored in the buffer circuit 323.

At the step S370, the core circuit 326 may report to the sequencer 324 a determination result that a result of normal decoding satisfies the fast decoding condition.

At step S380, the sequencer 324 may modify the decoding information based on the determination result. The modified decoding information may include a decoding type indicating fast decoding. The sequencer 324 may store the modified decoding information in the decoding information memory 325 or directly transmit the modified decoding information to the core circuit 326.

At step S390, the core circuit 326 may perform fast decoding on at least one subsequent data chunk which is stored in the buffer circuit 323, based on the modified decoding information. An execution time of fast decoding may be shorter than an execution time of normal decoding. The core circuit 326 may perform fast decoding on all the remaining data chunks on which normal decoding has not been performed.

At the step S400, the core circuit 326 may report a decoding result to the sequencer 324. The core circuit 326 may report to the sequencer 324 that normal decoding or fast decoding has been performed for all the data chunks, as the decoding result.

At step S410, the sequencer 324 may modify the decoding information based on the decoding result. The modified decoding information may include a decoding type indicating additional decoding. According to an embodiment, the modified decoding information may indicate at least one selected data chunk on which additional decoding is to be performed. The sequencer 324 may store the modified decoding information in the decoding information memory 325 or directly transmit the modified decoding information to the core circuit 326.

At step S420, the core circuit 326 may perform additional decoding on a data chunk which is selected among all the data chunks, based on the modified decoding information. The core circuit 326 may perform additional decoding on a data chunk on which normal decoding has failed or a data chunk on which fast decoding has been performed, among all the data chunks.

At step S430, the core circuit 326 may report an additional decoding result to the sequencer 324. The core circuit 326 may report to the sequencer 324 whether additional decoding on selected data chunks is a success/failure, as the additional decoding result. Then, when additional decoding is a success, the sequencer 324 may transmit a decoding end signal to the processor 310 such that all the data chunks are transmitted to the external device.

Figure 8:
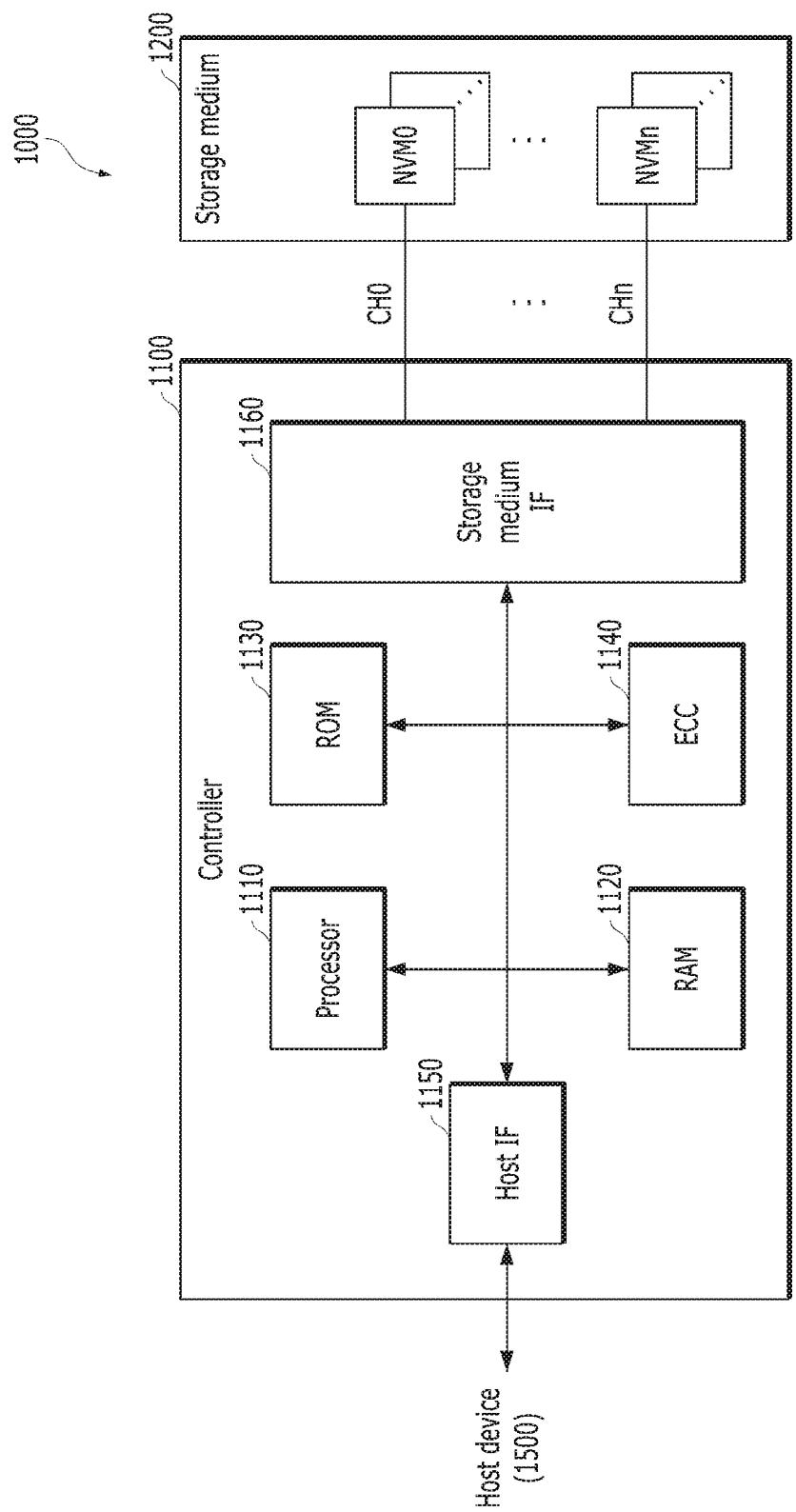
FIG. 8 is a block diagram illustrating a solid state drive (SSD), according to an embodiment of the invention.

FIG. 8 is a block diagram illustrating a solid state drive (SSD) 1000, according to an embodiment of the invention, the SSD 1000 comprising a controller 1100 and a storage medium 1200.

The controller 1100 may control the data exchange between a host device 1500 and the storage medium 1200. The controller 1100 may include a processor 1110, a RAM 1120, a ROM 1130, an ECC unit 1140, a host interface 1150, and a storage medium interface 1160.

The processor 1110 may control the general operations of the controller 1100. The processor 1110 may store data in the storage medium 1200 and read stored data from the storage medium 1200, in response to data processing requests from the host device 1500. In order to efficiently manage the storage medium 1200, the processor 1110 may control the internal operations of the SSD 1000 such as a merge operation, a wear leveling operation, and so forth. The processor 1110 may operate in a manner substantially similar to the processor 110 shown in FIG. 1B.

The RAM 1120 may store programs and program data to be used by the processor 1110. The RAM 1120 may temporarily store the data transmitted from the host interface 1150 before transferring to the storage medium 1200. The RAM 1120 may temporarily store the data transmitted from the storage medium 1200 before transferring it to the host device 1500.

The ROM 1130 may store program codes to be read by the processor 1110. The program codes may include commands to be processed by the processor 1110, in order for the processor 1110 to controlzc the internal units of the controller 1100.

The ECC unit 1140 may decode the data read from the storage medium 1200. The ECC unit 1140 may operate in a manner substantially similar to the data processing block 120 shown in FIG. 1. When decoding a plurality of data chunks sequentially read from the storage medium 1200, the ECC unit 1140 may perform normal decoding or fast decoding for a succeeding data chunk, based on a result of normal decoding for a previous data chunk. The ECC unit 1140 may include a plurality of decoders which perform decoding in a stepwise manner. The plurality of decoders may perform additional decoding for data chunks which the previous decoders thereof have failed to decode.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation under the control of the controller 1100.

Figure 9:
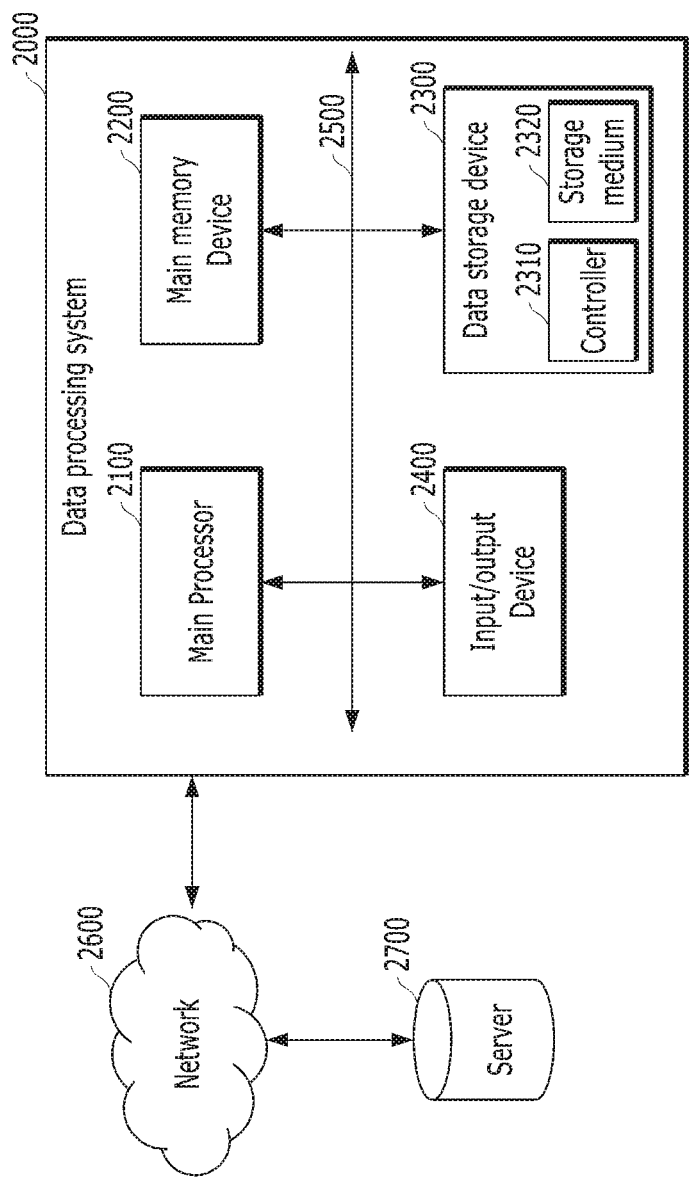
FIG. 9 is a block diagram illustrating a data processing system including a data storage device, according to an embodiment of the invention.

FIG. 9 is a block diagram illustrating a data processing system 2000 including a data storage device according to an embodiment of the invention.

The data processing system 2000 may be or comprise a computer, a laptop, a netbook, a smart phone, a digital TV, a digital camera, a navigator, or the like. For example, the data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control the general operations of the data processing system 2000. The main processor 2100 may be, for example, a central processing unit such as a microprocessor. The main processor 2100 may execute the softwares of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a memory controller 2310 and a storage medium 2320. The data storage device 2300 may be configured and operate in a substantially similar way as the data storage device 10 shown in FIG. 1B.

The input/output device 2400 may include a keyboard, a scanner, a touch screen, a mouse, or the like, capable of exchanging data with a user. The input/output device 2400 may receive a command for controlling the data processing system 2000 from the user or provide a processed result to the user.

According to an embodiment, the data processing system 2000 may communicate with at least one server 2700 through a network 2600 such as a LAN (local area network), a WAN (wide area network), a wireless network, and the like. The data processing system 2000 may include a network interface (not shown) to access the network 2600.

Figure 10:
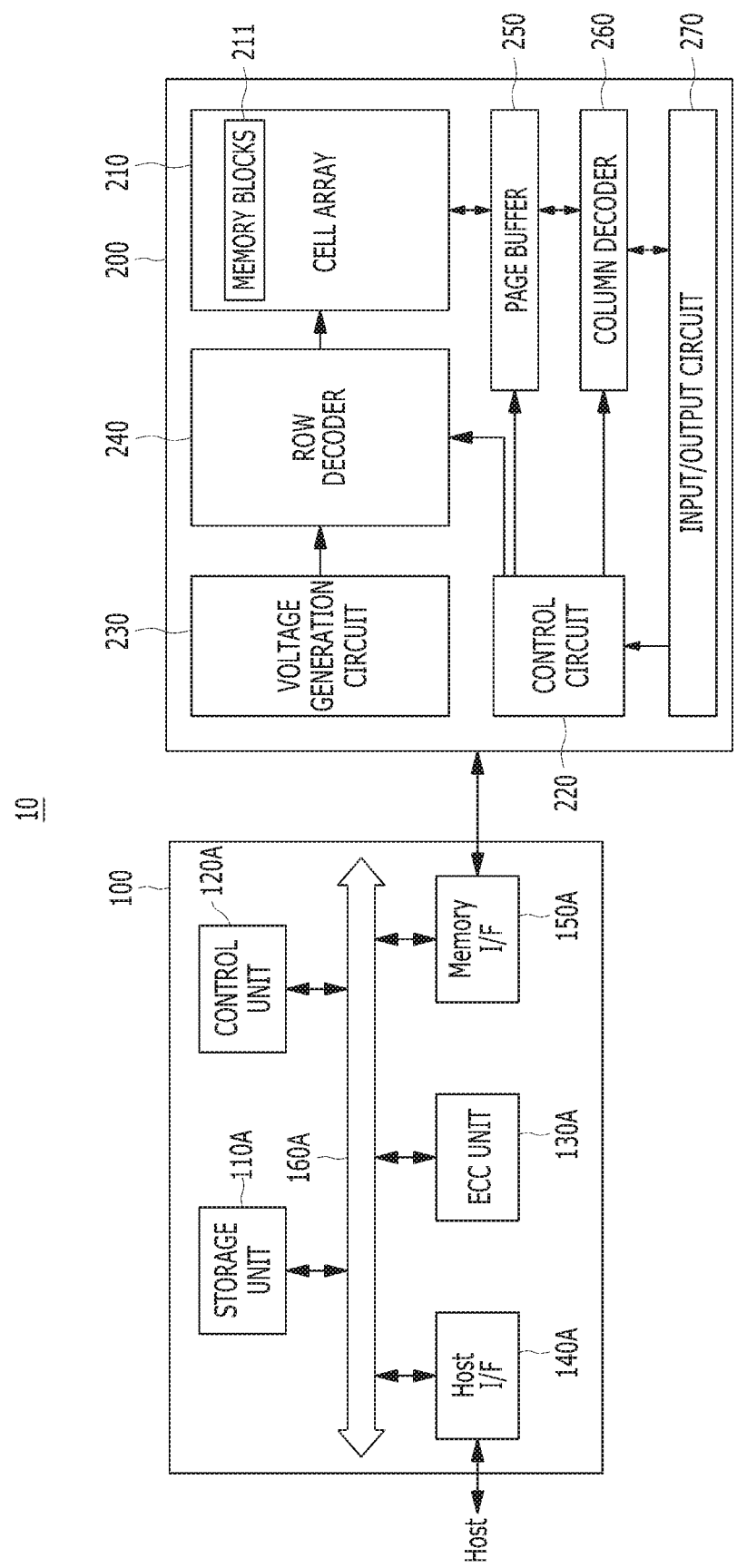
FIG. 10 is a block diagram illustrating a memory system in accordance with an embodiment of the present invention.

FIG. 10 is a detailed block diagram illustrating a memory system in accordance with an embodiment of the present invention. For example, the memory system of FIG. 10 may depict the memory system 10 shown in FIG. 1A.

Referring to FIG. 10, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random-access memory (DRAM) and a static random-access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random-access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110A, a control unit 120A, the error correction code (ECC) unit 130A, a host interface 140A and a memory interface 150A, which are coupled through a bus 160A.

The storage unit 110A may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110A may be implemented with a volatile memory. The storage unit 110A may be implemented with a static random-access memory (SRAM) or a dynamic random-access memory (DRAM). As described above, the storage unit 110A may store data used by the host device in the memory device 200 for the read and write operations. To store the data, the storage unit 110A may include a program memory, a data memory, a write buffer, a read buffer, a map buffer, and so forth.

The control unit 120A may control general operations of the memory system 10, and a write operation or a read operation for the memory device 200, in response to a write request or a read request from the host device. The control unit 120A may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130A may detect and correct errors in the data read from the memory device 200 during the read operation. The ECC unit 130A may not correct error bits when the number of the error bits is greater than or equal to a threshold number of correctable error bits, and may output an error correction fail signal indicating failure in correcting the error bits.

In some embodiments, the ECC unit 130A may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130A may include all circuits, systems or devices for the error correction operation.

The host interface 140A may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150A may provide an interface between the controller 100 and the memory device 200 to allow the controller 100 to control the memory device 200 in response to a request from the host device. The memory interface 150A may generate control signals for the memory device 200 and process data under the control of the CPU 120A. When the memory device 200 is a flash memory such as a NAND flash memory, the memory interface 150A may generate control signals for the memory and process data under the control of the CPU 120A.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220. The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270. The control circuit 220 may control the peripheral circuit in response to the command and the address.

Figure 11:
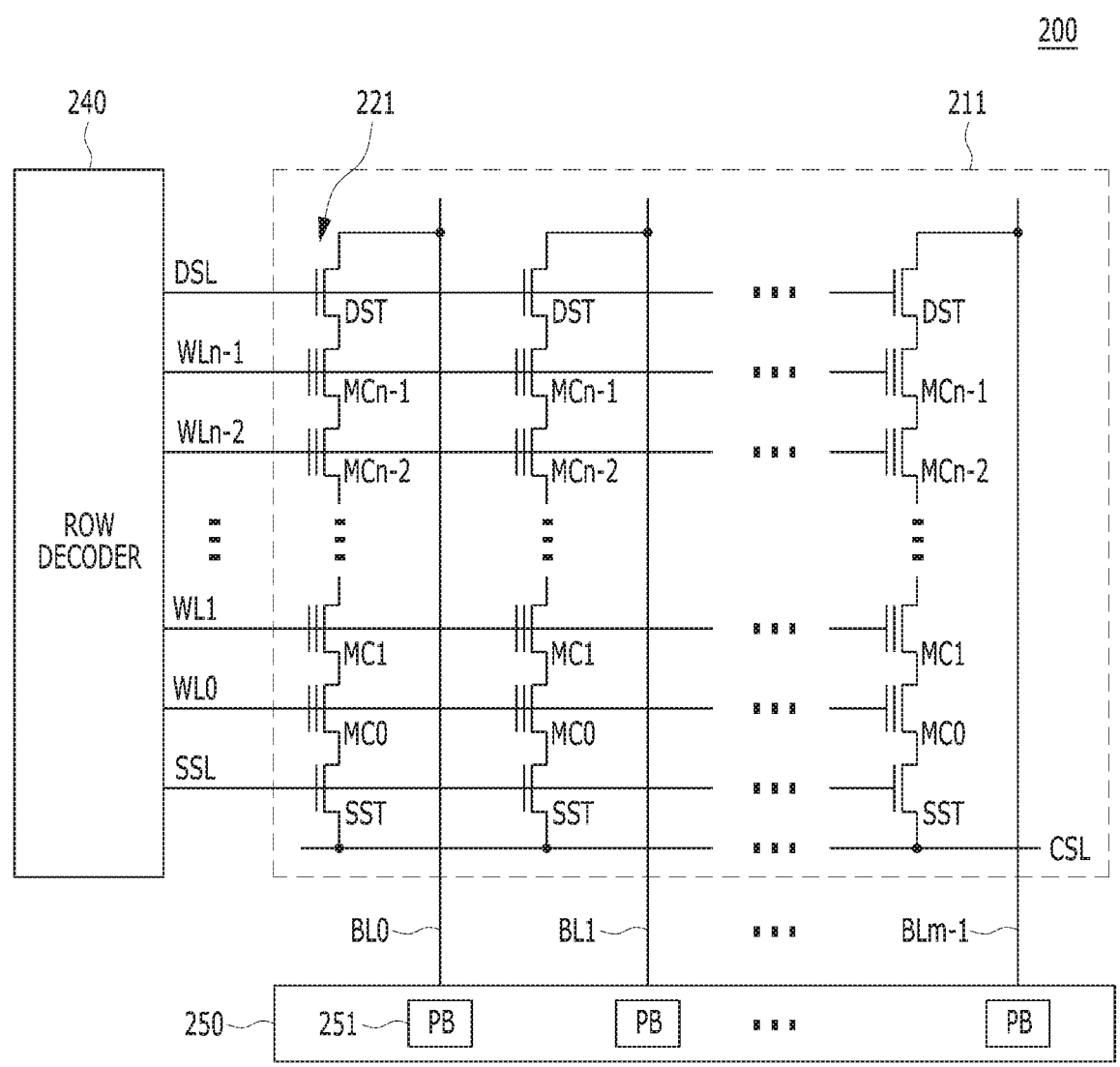
FIG. 11 is a circuit diagram illustrating a memory block of a memory device in accordance with an embodiment of the present invention.

FIG. 11 is a circuit diagram illustrating a memory block of a semiconductor memory device in accordance with an embodiment of the present invention. For example, a memory block of FIG. 11 may be the memory blocks 211 of the memory cell array 200 shown in FIG. 10.

Referring to FIG. 11, the memory blocks 211 may include a plurality of cell strings 221 coupled to bit lines BL0 to BLm-1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data information of multiple bits in each cell. The cell strings 221 may be electrically coupled to the corresponding bit lines BL0 to BLm-1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 12:
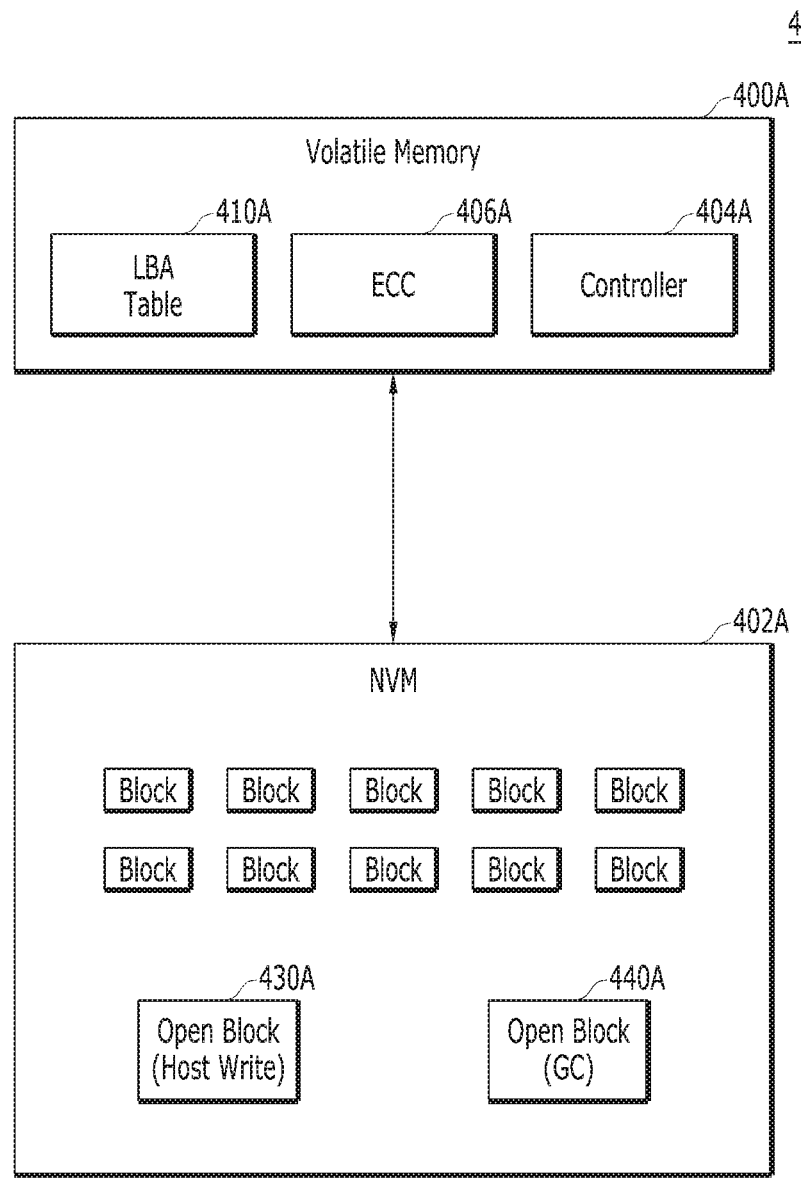
FIG. 12 is a diagram illustrating multiple optimal read reference voltages of a memory system in accordance with an embodiment of the present invention.

FIG. 12 is a diagram schematically illustrating top level block diagram of a memory system in accordance with an embodiment of the present invention. At FIG. 12, a general example of a memory system 40A is shown. The memory system 40A may include a volatile memory 400A (e.g., a DRAM) and a non-volatile memory (NVM) 402A (e.g., NAND) in communication with the volatile memory 400A. The volatile memory 400A may include a controller 404A, such as the controllers described herein, an error correcting code module 406A, and a logical bit address LBA table 410A for mapping physical to logical addresses of bits. The NVM 402A may include a plurality of memory blocks (and/or a plurality of super memory blocks), as well as an open block for host writes 430A and an open block for garbage collection (GC) 440A. The memory system 40A shows a general memory system, and additional/alternative components that may be utilized with memory systems to effectuate the invention disclosed herein will be understood to those of skill in the art.

As referred to herein, terms such as "NAND" or "NVM" may refer to non-volatile memories such as flash memories which may implement error correcting code processes. Further, "DRAM" may refer to volatile memories which may include components such as controllers and ECC modules.

Since data written on a NAND is subject to read errors (e.g., bit flips when read), the data written on the NAND may be protected by error correcting codes "ECCs". However, ECC decoding may still fail in some cases, such as cases due to NAND defects or other interferences.

To recover data after an ECC error, XOR-based recovery schemes are commonly used. In general, with an XOR-based scheme, the bitwise XOR of data pages from different die-plane pairs may be calculated and saved in a page called a "parity page", which together with the data pages may be referred to as a "stripe".

Figure 13:
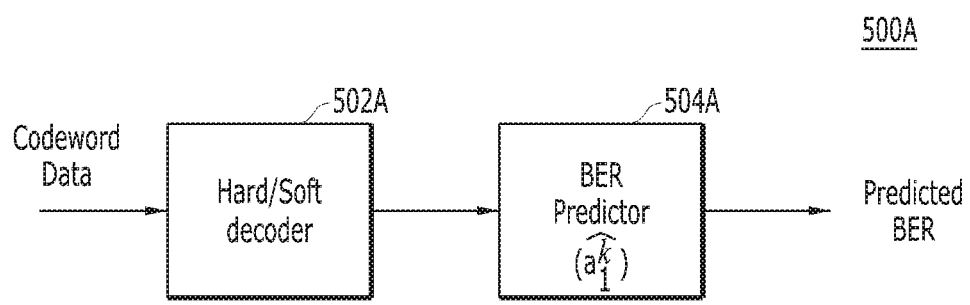
FIG. 13 is a diagram schematically illustrating top level block diagram of page health prediction of a memory system in accordance with an embodiment of the present invention.

FIG. 13 is a diagram schematically illustrating top level block diagram of page health prediction of a memory system in accordance with an embodiment of the present invention. The top level diagram 500A can comprise a hard/soft decoder 502A and a BER predictor 504A. The codeword data can be input to the hard/soft decoder 502A, and output of the BER predictor 504A can be predicated BER.

The codeword data coded with the error control coding scheme can be provided to the hard/soft decoder 502A for decoding. If the codewords of the codeword data can be decoded successfully, the iteration decoding process can be ended successfully. If the codewords of the codeword data cannot be decoded successfully, the failed codewords at ith iteration can be used for the BER estimation or predication. Typically, the hard/soft decoder 502A starts with hard decoding, and proceed with soft decoding when the hard decoding is failed.

The BER estimation can be defined as $$\vec{\alpha}_1^k = \operatorname{argmin}_{\alpha_1}{}^k (\text{BER} = \Sigma_{i=1}{}^k F_i \alpha_i)^2$$

Where the BER is the bit error rate of the codeword of the codeword data, $F_i$ is the number of failed constituent codewords at ith iteration from the hard/soft decoder 502A, $\alpha_i$ is the estimator coefficient for the prediction, "argmin" stands for argument of the minimum, which is smallest value of function of the arguments.

If L samples are used to find the estimated $\vec{\alpha}_1^k$ the BER vector can be written as, $A\alpha_1{}^k = B$, where $$A = \begin{pmatrix} F_1^1 & \cdots & F_k^1 \\ \vdots & \ddots & \vdots \\ F_1^L & \cdots & F_k^L \end{pmatrix} \text{ and } B = \begin{pmatrix} BER_1 \\ BER_2 \\ \cdots \\ \cdots \\ BER_L \end{pmatrix}.$$

Where the L samples comprises L samples for different data points, and corresponding L codewords with different BER can be generated offline and decoding thereof can be performed for k iterations. Each row of matrix A corresponds to one of the L vectors/samples, and each of the L samples comprises the numbers of failed constituent codewords of each of the k iterations. Wherein more elements or points in the L samples can predict higher accuracy of line slope, resulting in more accurate BER prediction.

The estimated $\vec{\alpha}_1^k$ given as, $$\vec{\alpha}_1^k = (A^T A)^{-1} A^T B,$$

Where $A^T$ is transpose of A, $(A^T A)^{-1}$ is inverse of $(A^T A)$. Observed in simulations, after 3 iterations, the decoder data of matrix A entities is good enough to predict the BER with reasonable accuracy. A tradeoff between the accuracy of the BER prediction and the number of iterations k needs to be determined in accordance with the memory system configuration.

Figure 14:
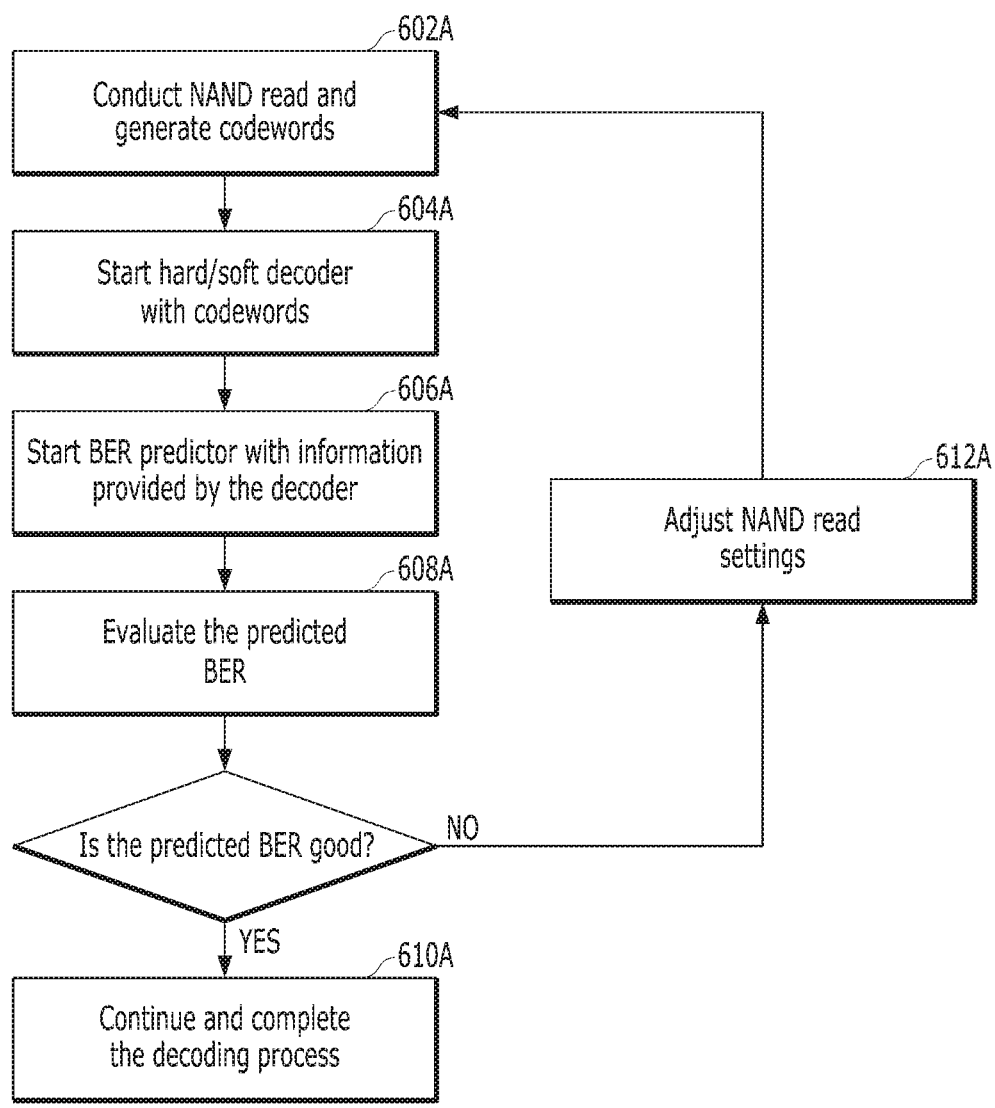
FIG. 14 is a flow diagram illustrating page health prediction of a memory system in accordance with an embodiment of the present invention.

FIG. 14 is a flow diagram illustrating page health prediction of a memory system in accordance with an embodiment of the present invention. The page health prediction process can include numerous iterations, although a typical number of iteration can be set as three.

For example, the page health prediction process can start from a NAND read and codewords generation in a step of 602A. During the first iteration when i=1, a first codeword data, such as the first set of L samples, can be provided to the hard/soft decoder 502A of FIG. 13, wherein the index i is an integer and 1≤i≤k. The hard/soft decoder 502A can starts the decoding process at time T1 in a step of 604A. As soon as sufficient decoder information collected to start the BER prediction process, the hard/soft decoder 502A can forward the collected decoder information to the BER predictor 504A to start the BER prediction process at time T2 in a step of 606A, wherein the collected decoder information can include the numbers of failed constituent codewords of the L samples at the current iteration, such as iteration 0. For example, the BER prediction process can provide a prediction result at time T3 before the decoding process can be completed at time T4, wherein T1<T2<T3<T4. The collected decoder information can include product codes, wherein the product codes can be constructed in any number dimensions by interleaving data in any dimension. For example, when m denotes the number of dimension and/denotes the number of iterations, the product codes can be constructed with a number of the features of data information, such as the number of codewords decoded and number of codewords failed in each dimension. The number of features of data information can be calculated as 2*m*l, wherein the features of data information can be provided for predicting BER.

The BER predictor 504A can calculate the predicted BER before the decoding iteration completion. The predicted BER can be provided to a plurality functional blocks for various purposes, such that, the ECC controller can use the predicted BER to evaluate and further optimize the ECC process, or the memory controller can use the predicted BER to choose an optimal read reference threshold. The predicted BER can be evaluated and categorized in a step of 608, such that the predicted BER can be categorized to different levels, such as good, bad, or very bad.

If the predicted BER is evaluated as good, most likely that the decoding iteration can be successful, the decoding iteration can be continued until completion in a step of 610A. If the predicted BER is evaluated as not good, the NAND read settings can be adjusted in accordance with the predicted BER of the current iteration in a step of 612A, a second NAND read can be performed, and a second codeword data, such as a second set of L samples can be provided to the hard/soft decoder 502A to start a second iteration of decoding, where i=2. The NAND read setting for the second NAND read can be adjusted responsively to the current predicted BER, such that, if the predicted BER is very bad the NAND setting can be adjusted dramatically, or if the predicted BER is bad but not very bad, the NAND setting can be adjusted moderately. The second iteration of decoding and BER predication can be performed with the second set of codeword data, the predicted BER can be evaluated again to determine if another iteration is needed for a successful decoding.

Optionally, the BER evaluation may be repeated in the same iteration a certain time after the first BER evaluation, with an updated set of the numbers of failed constituent codewords of the L samples at the current iteration, when the categorization of the predicted BER is bad but not very bad. The probability of successful decoding can be re-evaluated, the updated evaluation result can be used to determine whether the decoding process can continuedly proceed, or to adjust the NAND read setting and restart another decoding iteration.

The parameters for categorizing the predicted BER can be predetermined in accordance with the memory system configuration. For a certain value of the predicted BER, categorization of the predicted BER as good, bad, or very bad, can be different in different memory system. For example, a predicted BER can be categorized as good in one memory system, or as bad in another memory system.

If a third iteration is needed for the successful decoding, the NAND read settings can be adjusted again for a third NAND read and a third decoding iteration, where i=3. The hard/soft decoder 502A and the BER predictor 504A can repeat the decoding iterations described above, and more iterations may be conducted. The maximum number of iterations can be predetermined in accordance with the memory system configuration and request. However, simulation shows that 3 iterations can be sufficient to estimate a reasonably accurate BER without prolonging the decoding process.

The embodiments of the present invention disclose a memory system and operating method thereof for predicting page health of the memory blocks. The page health prediction is very important to the memory system, since the accurate page health prediction can reduce the write amplification and decoding latency time. The page health prediction, such as the predicted BER, can be used in various applications, such as ECC controller for optimizing ECC process, or memory controller for selecting an optimal read reference threshold.

Advanced to the traditional decoding process, instead of waiting until the end of the decoding process to know if the decoding process is successful, the embodiments of the present invention provide a novel memory system and operating method thereof, which can predict whether the decoding process can be successful ahead of completion of the current decoding iteration. Furthermore, the prediction can be utilized to adjust NAND read settings and restart another decoding iteration with updated NAND data according to the adjusted NAND read settings, resulting in a more accurate prediction and a shorter decoding latency time.

Another application of utilization of the page health prediction can be for garbage collection of the memory system. It has been discovered that the memory system and the operating method of page health prediction can dramatically improve the decoding success rate and reduce decoding latency time, further improve the memory system performance and reduce the power consumption.

Figure 15:
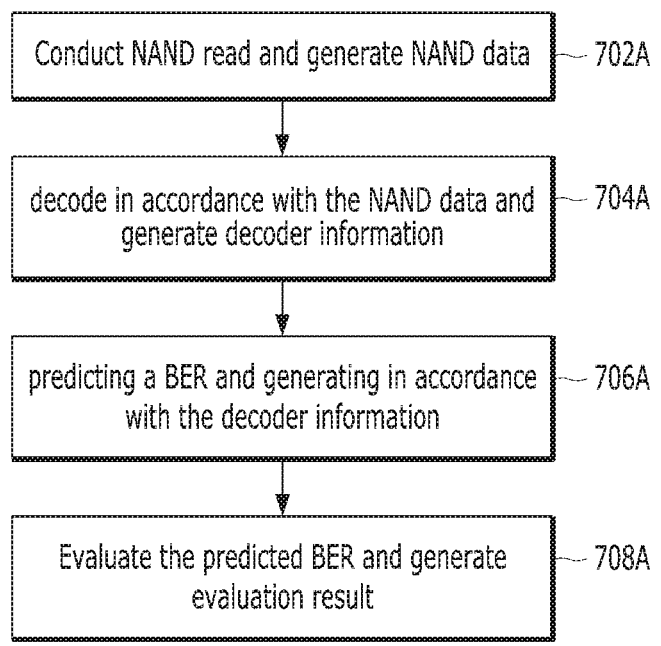
FIG. 15 is a flow chart illustrating a method of page health prediction of a memory system in accordance with a further embodiment of the present invention.

FIG. 15 is a flow chart illustrating a method of page health prediction of a memory system in accordance with a further embodiment of the present invention. The method comprising: performing a decoding iteration includes conducting NAND read and generating NAND data in a block of 702A; decoding in accordance with the NAND data and generating decoder information in a block of 704A; predicting a BER in accordance with the decoder information in a block of 706A; and evaluating the predicted BER and generating evaluation result in a block of 708A.

Thus, it has been discovered that the architecture of a memory system of the present invention furnishes important and heretofore unknown and unavailable solutions, capabilities, and functional aspects for a unified optimized acceleration architecture. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

Generally, LDPC decoding uses an iterative decoding process. The iterative decoding process ends based on two parameters. First, if a syndrome of a decoded codeword is zero, the iterative decoding for that codeword is terminated. The syndrome is zero when all errors, if any were existent, have been corrected by the LDPC decoder. Second, if the syndrome is not zero, but the number of iterations reaches a maximum number, the iterative decoding ends. This scenario occurs when the iterative decoding does not correct all the errors. Under this scenario, the iterative decoding is repeated until the maximum number of iterations regardless of information that the non-zero syndrome may reveal. Because the iterative decoding is "blindly" repeated until the maximum number of iterations, its overall latency and processing performance directly depends on this maximum number. The larger the maximum number is, the worse the latency and processing burden can become.

To improve the latency and processing performance, embodiments of the present disclosure are directed to an early termination of LDPC decoding. In an example, a set of additional parameters is introduced to terminate the iterative decoding procedure prior to reaching the maximum number of iterations. This set relates to information that the non-zero syndrome reveals about the decoding. The weight of the non-zero syndrome represents the checksum of the codeword. If after a certain number of iterations, the non-zero weight of the syndrome is too large, that large weight indicates that the likelihood of correcting all the errors of the codeword is low, even if the maximum number of iterations is performed. In another illustration, if the change to the weight of the syndrome between the iterations indicates that the weight is not properly improving (e.g., its value is not zero and is increasing, staying constant or relatively stable, or not decreasing at an acceptable decrease rate), the likelihood of correcting all the errors of the codeword is also low, even if the maximum number of iterations is performed. Hence, under these two scenarios, terminating the iterative decoding prior to reaching the maximum number of iterations is advantageous because the early termination improves the latency and reduces the processing burden without a significant degradation, if any, to the correction capability of the iterative decoding (e.g., to the bit error rate (BER) performance).

Hence, various embodiments of the present disclosure involve the use of the additional set parameter for the early termination of the iterative decoding procedure. In an example, this set includes the number of iterations and the weight of the syndrome. More specifically, the number of iterations is monitored. When the number for a current iteration reaches an iteration number threshold that is smaller than the maximum number of iterations, the weight of the non-zero syndrome is compared to a checksum threshold. If the comparison indicates that the weight of non-zero syndrome at the current iteration is greater than the checksum threshold, the likelihood of correcting all the errors of the codeword is low even if subsequent iterations are performed up to the maximum number of iterations. Accordingly, the iterative decoding is terminated at the current iteration. On the other hand, if the comparison indicates that the weight of the non-zero syndrome at the current iteration is smaller than the checksum threshold, one or more of the subsequent iterations are performed.

In the interest of clarity of explanation, the embodiments of the present disclosure are described in connection with LDPC decoding. However, the embodiments are not limited as such and apply to other decoding procedures that rely on the syndrome of a codeword.

Figure 16:
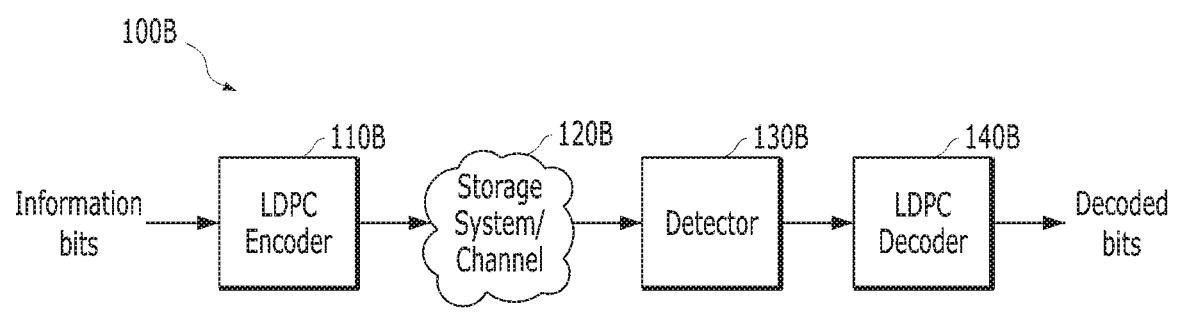
FIG. 16 illustrates an example high level block diagram of an error correcting system, in accordance with certain embodiments of the present disclosure.

FIG. 16 illustrates an example high level block diagram of an error correcting system 100B, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods, Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110B receives information bits that include data which is desired to be stored in a storage system 120B. LDPC encoded data is output by the LDPC encoder 110B and is written to the storage 120B.

In various embodiments, the storage 120B may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130B receives data from the storage system 120B. The received data may include some noise or errors. The detector 130B performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140B which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140B are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity-check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of pxp matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of pxp matrix can be a zero matrix or cyclically shifted identity matrix of size pxp.

Figures 17A, 17B:
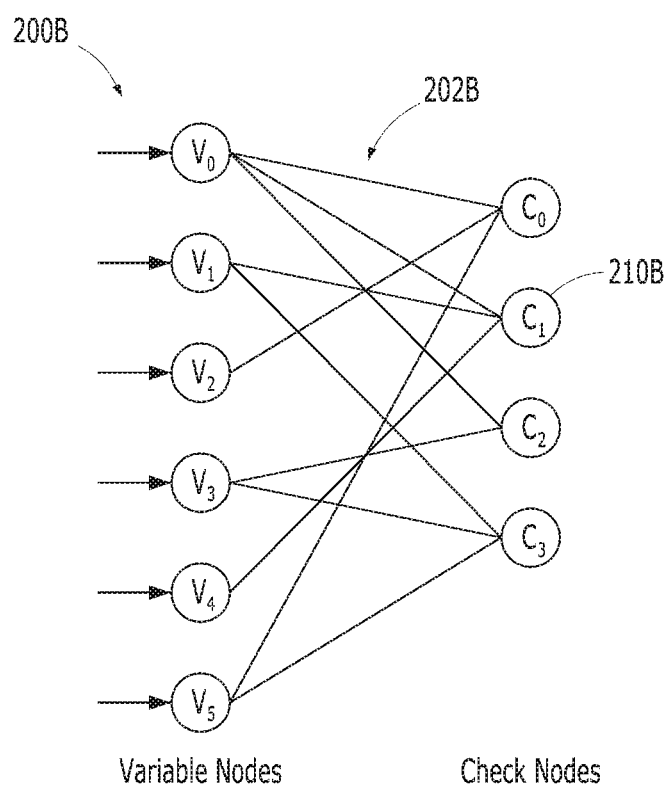
FIGS. 17A-17B illustrate an example parity-check matrix and an example graph representing the parity-check matrix, in accordance with certain embodiments of the present disclosure.

FIG. 17A illustrates an example parity-check matrix H 200B and FIG. 17B illustrates an example bipartite graph corresponding to the parity-check matrix 200B, in accordance with certain embodiments of the present disclosure. In this example, the parity-check matrix 200B has six column vectors and four row vectors. Network 202B shows the network corresponding to the parity-check matrix 200B and represent a bipartite graph. Various type of bipartite graphs are possible, including, for example, a Tanner graph.

Generally, the variable nodes in the network 202B correspond to the column vectors in the parity-check matrix 200B. The check nodes in the network 202B correspond to the row vectors of the parity-check matrix 2003. The interconnections between the nodes are determined by the values of the parity-check matrix 2003. Specifically, a "1" indicates the corresponding check node and variable nodes have a connection. A "0" indicates there is no connection. For example, the "1" in the leftmost column vector and the second row vector from the top in the parity-check matrix 2003 corresponds to the connection between the variable node 2043 and the check node 2103.

A message passing algorithm is generally used to decode LDPC codes. Several variations of the message passing algorithm exist in the art, such as min-sum algorithm, scaled min-sum algorithm or the like. In general, any of the variations of the message passing algorithm may be used in an LDPC decoder without departing from the teachings of the present disclosure. Message passing uses a network of variable nodes and check nodes, as shown in FIG. 17B. The connections between variable nodes and check nodes are described by and correspond to the values of the parity-check matrix 200, as shown in FIG. 17A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword as further illustrated in the next figures. It should be noted that a soft-decision decoder works similarly, however, each of the messages that are passed among check nodes and variable nodes, also include reliability of each bit.

An example message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $(L(c_i))$ represents initial LLR value for each variable node $v_i$. Variable node processing for each $L(q_{ij})$ can be done through the following steps:

(1) Read $L(c_i)$ and $L(r_{ji})$ from memory.
(2) Calculate $L(Qi\text{-sum})=L(c_i)+\text{Scaling Factor}*\Sigma_{j \in c_i} L(r_{ij})$.
(3) Calculate each $L(Qi\text{-sum})-L(r_{ij})$.
(4) Output $L(Qi\text{-sum})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj - \text{sum}) = \left(\prod_{i' \in R_j} \alpha_{i'j}\right) \phi\left(\sum_{i' \in R_j} \phi(\beta_{i'j})\right)$$

$$\alpha_{ij} = \text{sign}(L(q_{ij})), \quad \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(3) Calculate the individual $L(r_{ji}) = (\prod_{i' \in R_{j|i}} \alpha_{i'j}) \phi(\sum_{i' \in R_{j|i}} \phi(\beta_{i'j}))$ for check nodes.
(4) Write back $L(r_{ji})$ to memory.
(5) If this is not the last row of memory, then go to the first step and increment j by one.

Figure 18:
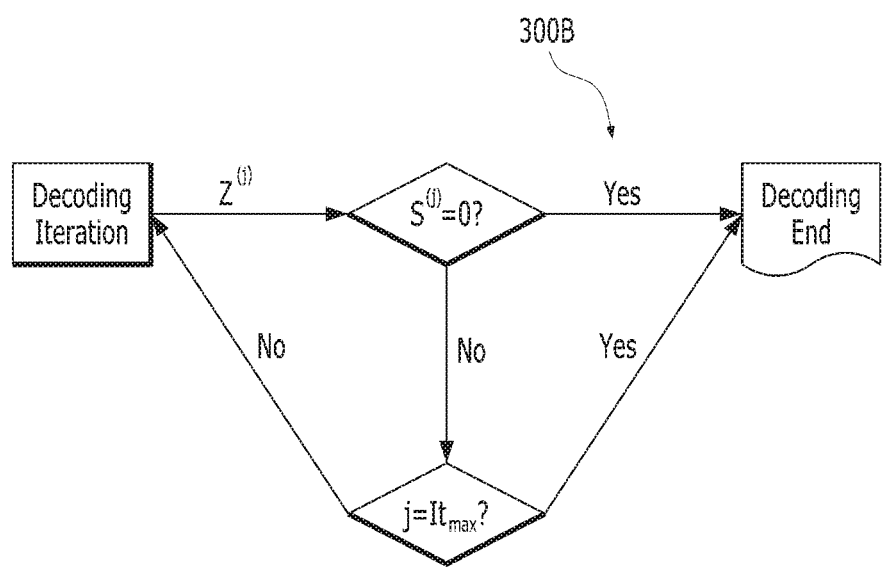
FIG. 18 illustrates an example diagram for terminating an LDPC iterative decoding based on a syndrome and maximum number of iterations, in accordance with certain embodiments of the present disclosure.

FIG. 18 illustrates an example diagram 300B for terminating an LDPC iterative decoding based on a syndrome and maximum number of iterations, in accordance with certain embodiments of the present disclosure. The termination depends on either the syndrome of a codeword being a zero or the number of iterations reaching the maximum number.

As illustrated in diagram 300B, suppose that $x=[x_0, x_1, \ldots, x_{N-1}]$ is a bit vector, and $H=[h_{i,j}]$ is an M×N low-density parity-check matrix with a binary value $h_{i,j}$ at the intersection of row i and column j. Then each row of H provides a parity check for x. If x is a codeword of H, $xH^T=0$ because of the LDPC code construction. Assume that x is transmitted over a noisy channel, and the corrupted channel output is $y=[y_0, y_1, \ldots, y_{N-1}]$ and its hard decision is $z=[z_0, z_1, \ldots, z_{N-1}]$. The syndrome of z is a binary vector calculated by $s=[s_0, s_1, \ldots, s_{N-1}]=zH^T$, with a weight of $\|s\|$. The weight of $\|s\|$ represents the number of unsatisfied check nodes and is also called the checksum since $\|s\|=\sum_{i=0}^{M-1} s_i$. Suppose that $z^{(j)}=[z_0, z_1, \ldots, z_{N-1}]$ is the hard decision of the j-th iteration and the syndrome vector of the j-th iteration is $s^{(j)}=[s_0^{(j)}, s_1^{(j)}, \ldots, s_{N-1}^{(j)}]=z^{(j)}H^T$. Then $\|s\|^{(j)}$ is the checksum of the j-th iteration.

As further illustrated in diagram 300B, the iterative decoding is terminated either when the checksum is zero (shown with $s^{(j)}=0$), or when the checksum is non-zero and the iteration number reaches the predefined maximal iteration number (shown with $j=\text{It}_{max}$, where "$\text{It}_{max}$" is the maximum number of iterations). Otherwise, the iterative decoding is repeated.

Figure 19:
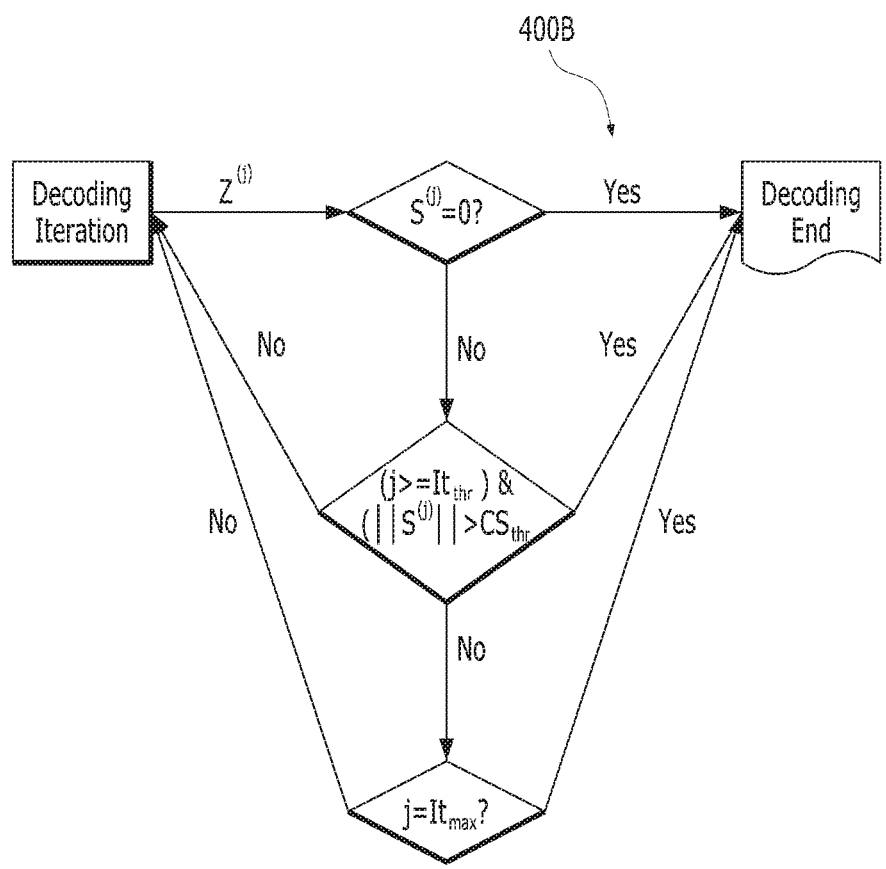
FIG. 19 illustrates an example diagram for early terminating an LDPC iterative decoding based on a current number of iterations and the syndrome at the current iteration, in accordance with certain embodiments of the present disclosure.

FIG. 19 illustrates an example diagram 400B for early terminating an LDPC iterative decoding based on a current number of iterations and the syndrome at the current iteration, in accordance with certain embodiments of the present disclosure. The termination of diagram 400B introduces an additional set of parameters: the iterative decoding is terminated prior to reaching the maximum number depending on the current iteration reaching a threshold iteration number and the information about the syndrome at the current iteration (e.g., the weight of the syndrome) being greater than a checksum threshold.

In an example, to reduce the average iteration number, two additional parameters are used. "$\text{It}_{thr}$" is defined as an iteration number threshold and "$CS_{thr}$" is defined as a checksum threshold. These two new parameters can be used to define an early termination rule for decoding termination, where this rule accounts also for a zero-syndrome and the maximum number of iterations "$\text{It}_{max}$". For instance, according to the early termination rule, the decoding algorithm is terminated either when the checksum is zero (shown with $s^{(j)}=0$), when the current number of iterations reaches the iteration number threshold and the weight of the syndrome (or, similarly, the checksum of the codeword) equals or exceeds the checksum threshold (shown as $j \geq \text{It}_{thr}$ and $\|s\|^{(j)} > CS_{thr}$), or when the maximum iteration number is reached.

Figure 20:
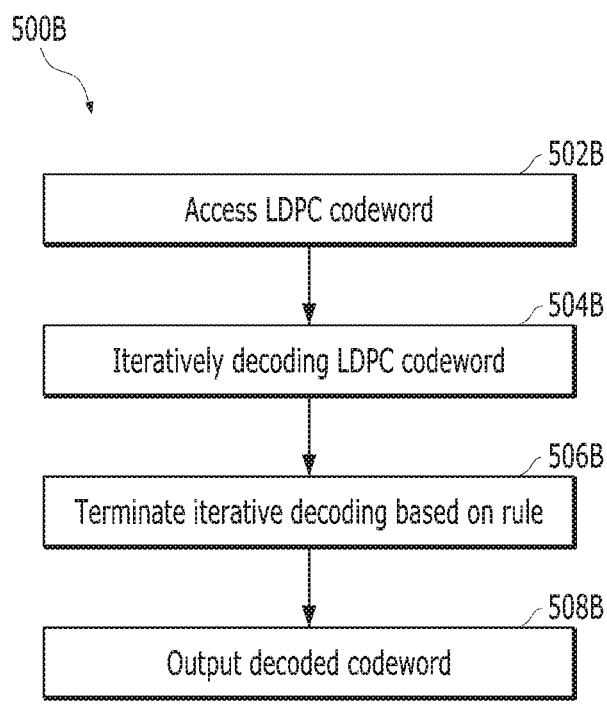
FIG. 20 illustrates an example flow for an LDPC iterative decoding, in accordance with certain embodiments of the present disclosure.
Figure 21:
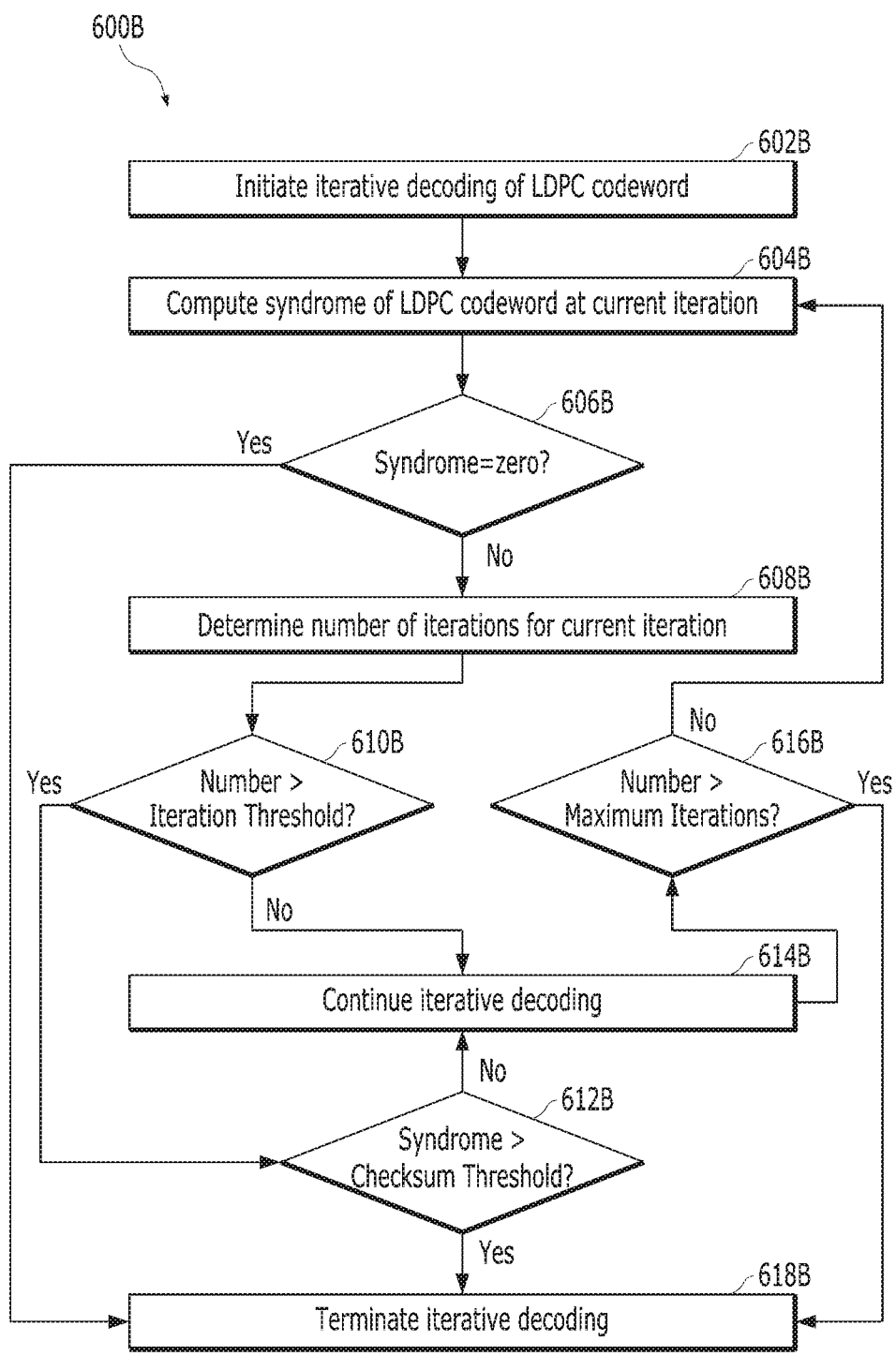
FIG. 21 illustrates an example flow for early termination of an LDPC iterative decoding based on a current number of iterations and the syndrome at the current iteration, in accordance with certain embodiments of the present disclosure.
Figure 22:
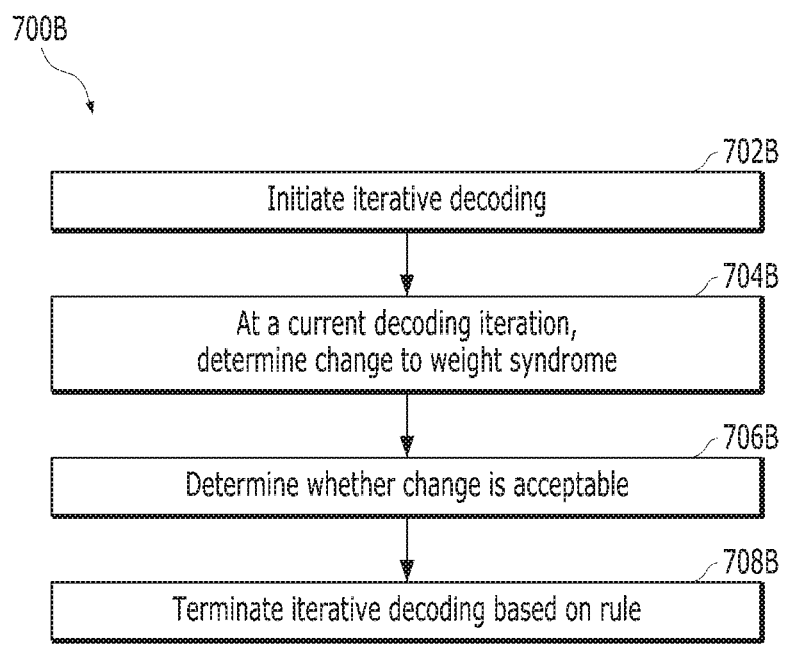
FIG. 22 illustrates an example flow forusing the syndrome at the current iteration to generate a decision for an early termination of an LDPC iterative decoding, in accordance with certain embodiments of the present disclosure.

FIGS. 20-22 illustrate example flows for decoding a codeword, such as an LDPC codeword, based on an iterative decoding process that uses an early termination rule, where this rule applies parameters that relate to the syndrome of the decoded codeword. A system is described as performing particular operations of the example flows. In particular, the system implements an error correcting system, such as the error correcting system 100B of FIG. 16. The system may have a specific hardware configuration to perform the operations of the error correcting system, including those of a decoder (e.g., an iterative decoder such as the LDPC decoder 140B of FIG. 16). Alternatively or additionally, the system may include generic hardware configured with specific instructions. In an example, the system includes one or more processors and one or more memories. The memory(ies) stores computer-readable instructions to embody functionalities specific to the system. The instructions, when executed by the processor(s) of the system, result in performance of the functionalities by the system. The instructions stored in the memory(ies) in conjunction with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 20 illustrates an example flow 500B for an LDPC iterative decoding, in accordance with certain embodiments of the present disclosure. As illustrated, the example flow 500B starts at operation 502B, where the system accesses an LDPC codeword. For example, the LDPC codeword is accessed from storage in response to a request for information bits stored in the storage. The information bits were encoded using an LDPC encoding process and stored in the storage.

At operation 504B, the system eratively decodes the LDPC codeword. For example, the system implements a hard or soft iterative LDPC decoding process and inputs the LDPC codeword to such a process. The iterative decoding process, whether soft or hard, monitors the number of iterations, computes the syndrome of the LDPC codeword (e.g., of the decoded codeword), and applies the early termination rule based on the syndrome and the number of iterations to either continue the iterative decoding or to terminate this decoding early prior to reaching the maximum number of iterations. These and other operations related to the early termination are further described in connection with the next figures.

At operation 506B, the system terminates the iterative decoding early (e.g., prior to reaching the maximum number of iterations) based on the early termination rule. In an example this rule includes various parameters that control the early termination prior to reaching the maximum number of iterations. One of the parameters is whether the syndrome is zero or not. If the syndrome is zero, the early termination rule specifies that the iterative decoding should stop at the current iteration. If the syndrome is non-zero, the system checks additional parameters.

One of the additional parameters is the current number of iterations. Another additional parameter is the weight of the syndrome. If the current number of iterations is less than an iteration number threshold, the iterative decoding proceeds to the next decoding iteration. In contrast, if the current number of iterations is equal to or greater than the iteration number threshold, the system checks the weight of the syndrome.

Various types of checks are possible (each of which may define an additional parameter). One example check compares the weight of the syndrome at the current iteration (e.g., the current value of this weight, or similarly, the current checksum of the decoded codeword at the current decoding iteration) and a checksum threshold (e.g, the weight is compared to the checksum threshold). If the comparison indicates that the weight is equal to or greater than the checksum threshold, the system terminates the iterative decoding at the current iteration. That is because the comparison indicates that the weight of the syndrome is too large such that the likelihood of correcting all the errors of the codeword is low even if the maximum number of iterations is performed. Otherwise, the iterative decoding proceeds to the next decoding iteration.

Another example check monitors the change to the weight of the syndrome from a number of previous decoding iterations (five, or half way from (or some other fraction or function) the current iteration to the maximum number of iterations) the start of the iterative decoding). If the change indicates that the weight is relatively stable (e.g., changes within a predefined weight range such as +/−1), is constant, is not improving (e.g., is worsening by increasing instead of decreasing), or is less than a predefined change rate threshold, the system terminates the iterative decoding at the current iteration. That is because the rate of change to the weight of the syndrome indicates that no significant BER gains are likely to be achieved even if the maximum number of iterations is performed. Otherwise, the iterative decoding proceeds to the next decoding iteration.

Of course, concurrent use of both types of checks is possible. For example, once the number of iterations reaches the iteration number threshold, the system compares the weight of the syndrome at the current iteration to the checksum threshold. If the weight is equal to or greater than the checksum threshold, the system starts monitoring the change to the weight of the syndrome over a next number of iterations to determine whether to terminate the iterative decoding at any of the subsequent decoding iterations but prior to reaching the maximum number of iterations (e.g., depending on whether the change indicates that the weight is relatively stable, is constant, is not improving, or is less than a predefined change rate threshold such as the weight decreasing by three (or some other values) between each iteration). This next number of iterations can be predefined (e.g., five, or half way from (or some other fraction or function) the current iteration to the maximum number of iterations)).

In an example, the various parametric values are predefined based on a simulation of the latency performance and/or processing performance of the system (or of the LDPC decoder). Generally, the simulation varies the different parametric values. The parametric values resulting in the best or desired latency performance and/or processing performance are stored in the memory of the system. As described herein above, these parameter values include the iteration number threshold, the checksum threshold, the change rate threshold, the number of previous decoding iterations, the number of additional decoding iterations, the weight range, and the maximum number of iterations. In an illustrative example, the maximum number of iterations is in the range of fifteen to twenty-five, the iteration number threshold is smaller than the maximum number of iterations and is in the range of ten to twenty, and checksum threshold is in the range of twenty-five to thirty-five. In another illustrative example, the iteration number threshold is in the range of sixty to eighty percent of the maximum number of iterations.

At operation 508B, the system outputs the decoded codeword. For example, upon termination of the iterative decoding process, the system determines the decoded information bits and outputs these information bits as being representative of the originally encoded and stored information bits.

FIG. 21 illustrates an example flow 600B for early termination of an LDPC iterative decoding based on a current number of iterations and the syndrome at the current iteration, in accordance with certain embodiments of the present disclosure. Some or all of the operations of example flow 600B may be implemented as sub-operations of operations 504B and 506B of the example flow 500B of FIG. 20.

As illustrated, the example flow 600B starts at operation 602B, where the system initiates an iterative decoding of an LDPC codeword. In an example, the iterative decoding is bounded by a maximum number of iterations. The system starts with the first iteration and sets an iteration counter to one. The iterative decoding uses soft or hard decoding.

At operation 604B, the system computes a syndrome associated the LDPC codeword at a current iteration. This syndrome corresponds to the checksum of the decoded LDPC codeword at the current iteration. The current iteration is the first iteration when operation 604B is performed for the first time after the initiation of the iterative decoding at operation 602B. Otherwise, the current iteration is the latest iteration through which the system is decoding the LDPC codeword. In an example, x is a codeword of H and $xH^T=0$ because of the LDPC code construction. The LDPC codeword under decoding is $y=[y_0, y_1, \ldots, y_{N-1}]$ and is different than because of x channel noise. In the current iteration, the system decodes y hard decision is $z=[z_0, z_1, \ldots, z_{N-1}]$. The system computes the syndrome of z as a binary vector calculated by $s=[s_0, s_1, \ldots, s_{N-1}]=zH^T$. The system also computes the weight of s as $\|s\|$. $z^{(j)}=[z_0, z_1, \ldots, z_{N-1}]$ is the hard decision of the j-th iteration (the current iteration) and the syndrome vector of the j-th iteration is $s^{(j)}=[s_0^{(j)}, s_1^{(j)}, \ldots, s_{N-1}^{(j)}]=z^{(j)}H^T$. Then $\|s\|^{(j)}$ is the weight (or, similarly, checksum) of the j-th iteration (the current iteration).

At operation 606B, the system determines whether the syndrome at the current iteration is zero or not. For example, if the weight is zero, the system determines that the syndrome is zero. Otherwise, the system determines that the syndrome is non-zero. If the syndrome is zero, operation 618B is performed after operation 606B and the system terminates the iterative decoding at the current iteration and outputs the decoded codeword. Otherwise, operation 608 is performed after operation 606B such that the system checks whether other parameters of the early termination rule are satisfied to support the early termination or not.

At operation 608B, the system determines the number of iterations that corresponds to the current iteration. For example, each time the system completes a decoding iteration, the system increases the iteration counter by one. Accordingly, the number of iterations performed so far and corresponding to the current iteration is determined from the current value of the iteration counter.

At operation 610B, the system determines whether the number of iterations corresponding to the current iteration is equal to or larger than an iteration number threshold and is smaller than the maximum number of iterations. For example, the system compares the current value of the iteration counter to the iteration number of threshold. If the current value is equal to or greater than the iteration number of threshold, the system determines that the number of iterations reached the iteration number threshold. In this case, operation 612B is performed after operation 610B, where the system further assesses if the iterative decoding should be terminated early. Otherwise, operation 614B is performed after operation 610B, where the system continues the iterative decoding.

At operation 612B, the system compares the syndrome at the current number of iterations to a checksum threshold. At this operation, the syndrome is non-zero. Generally, the comparing indicates whether the likelihood of correcting all the errors of the codeword is low even if the maximum number of iterations is performed. If so, the system can generate a decision for the early termination of the iterative decoding (as illustrated in connection with operation 618B).

Various types of the comparison are possible. The example flow 600B is illustrated in connection with comparing the weight of the syndrome (e.g., ||s||) to the checksum threshold. Other types of the comparison are possible. Example flow 700B of FIG. 22 illustrates a comparison based on a change to the weight of the syndrome between iterations. As further described in connection with FIG. 22, the checksum threshold includes a rate change threshold for comparison with the change to the weight.

In the example flow 600B, the system compares the weight of the syndrome to the checksum threshold. If the weight is equal to or greater than the checksum threshold, the system generates a decision for the early termination of the iterative decoding. Accordingly, operation 618B is performed after operation 612B, where the system terminates the iterative decoding and outputs the decoded codeword. Otherwise, operation 614B is performed after operation 612B.

At operation 614B, the system continues the iterative decoding. For example, the system proceeds with decoding the LDPC codeword in the next decoding iteration and increments the iteration counter by one.

At operation 616B, the system compares the number of the iterations corresponding to the current iteration (e.g., the current value of the iteration counter) to the maximum number of iterations. If this number is equal to or greater than the maximum number of iterations, operation 618B is performed after operation 616B, where the system terminates the iterative decoding and outputs the decoded codeword. Otherwise, operation 604B is performed after operation 614B, where the system loops back and computes the syndrome.

As illustrated in the example flow 600B of FIG. 21, operation 612B (where the syndrome is compared to the checksum threshold, such as by comparing the syndrome's weight or the decoded codeword's checksum to the checksum threshold) only after operation 610B indicates that the current number of iterations reaches the iteration number threshold, but prior to the current number of iterations reaching the maximum number of iterations. In this way, the system ensures that at least a minimum number of decoding iterations has been performed to build confidence in the iterative decoding and avoids a premature termination.

FIG. 22 illustrates an example flow for using the syndrome at the current iteration to generate a decision for an early termination of an LDPC iterative decoding, in accordance with certain embodiments of the present disclosure. Some or all of the operations of example flow 700B may be implemented as sub-operations of operations 504B and 506B of the example flow 500B of FIG. 20. Relative to the example flow 600B of FIG. 21, the example flow 700B represents the use of the change to the weight of the system as a parameter for the early termination.

As illustrated, the example flow 700B starts at operation 702B, where the system initiates the iterative decoding. At operation 704B, the system determines the change to the weight of the syndrome at a current decoding iteration. For example, the system computes the syndrome and its weight at each decoding iteration and monitors the change to weight between the iterations.

At operation 706B, the system determines whether the change is acceptable. This determination is typically performed only after the current number of iterations reaches the iteration number threshold to avoid a premature early termination. Various types of determination are possible. In one example, the system uses a change rate threshold. In this example, the system computes a rate of the change to the weight of the syndrome from one or more previous iterations to the current iteration. The system compares the rate of change to the change rate threshold. If the rate of change is lower than the change rate threshold, the system generates a decision to terminate the iterative decoding because the rate of change is unacceptable. Otherwise, such a decision is not generated.

In another example, the system does not use a change rate threshold. Instead, the system computes the change to the weight of the syndrome from one or more previous iterations to the current iteration. The system then determines whether the rate of the change is constant, has not improved, has worsened, or is relatively stable from the one or more previous iterations. If so, the system generates the decision to terminate the iterative decoding because the rate of change is unacceptable. Otherwise, this decision is not generated.

At operation 708B, the system terminates the iterative decoding based on an early termination rule. In this example, the rule specifies that if the change to the weight of syndrome was found unacceptable at operation 706B (and, thus, a decision for the early termination was generated), the system should terminate the iterative decoding at the current iteration. Accordingly, the system exits the iterative decoding and outputs the decoded codeword.

As previously described, a combination of using the comparison of the weight of the syndrome to the checksum threshold, similarly to what is illustrated in the example flow 600B of FIG. 21, and monitoring the rate of change to the weight between decoding iterations, similarly to what is illustrated in the example flow 700B of FIG. 22, is possible. For example, and referring back to operation 612B of the example flow 600B, the system determines that the weight of the syndrome at the current iteration is equal to or greater than the checksum threshold. Rather than generating a decision to terminate the iterative decoding, the system further investigates whether the likelihood of correcting all the errors of the codeword is low even if the maximum number of iterations is performed. In this case, instead of performing operation 618B after the operation 612B, the system performs operations similar to operations 704B-708B of the example flow 700B. In one specific example, the system determines the rate of change to the weight from a number of previous iterations to the current iteration (e.g., from the last five iterations) to generate the decision for the early termination as applicable. In another specific example, the system starts monitoring the rate of change to the weight from the current iteration to a number of subsequent iterations but prior to the iteration counter reaching the maximum number of iterations (e.g., over the next five iterations) to generate the decision for the early termination as applicable.

Figure 23:
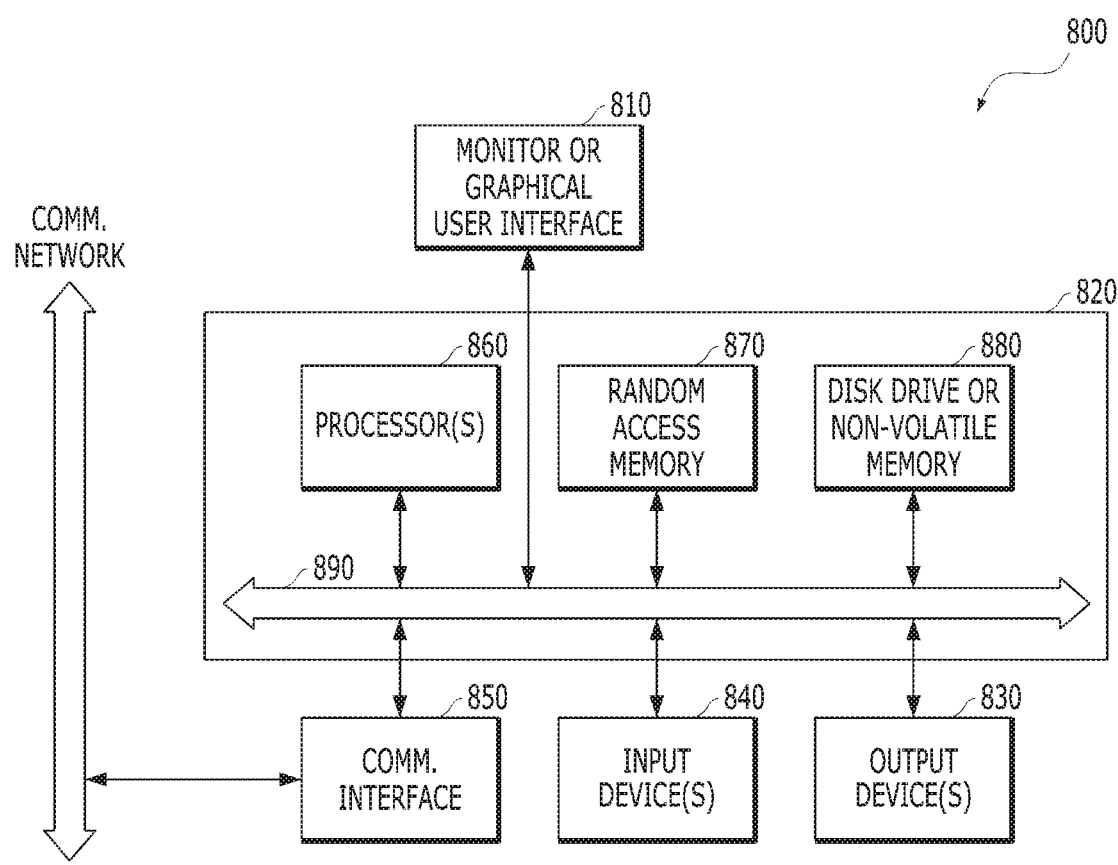
FIG. 23 is representative of a computer system capable of embodying the present disclosure.

FIG. 23 describes one potential implementation of a system, which may be used according to one embodiment, such as the error correction system 100B of FIG. 16. FIG. 23 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like. The error correction system 100 of FIG. 16 implements some or all of the components of the computer system 800.

As shown in FIG. 23, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 840 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 840 are typically embodied as a computer mouse, a trackball, a track pad, a joystick, a wireless remote, a drawing tablet, a voice command system, an eye tracking system, and the like. The user input devices 840 typically allow a user to select objects, icons, text and the like that appear on the monitor 810 via a command such as a click of a button or the like.

The user output devices 830 include all possible types of devices and mechanisms for outputting information from the computer 820. These may include a display (e.g., the monitor 810), non-visual displays such as audio output devices, etc.

The communications interface 850 provides an interface to other communication networks and devices. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read-only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 23 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium'm or Itanium'm microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

While various embodiments have been described above, it will be understood to those skilled in the art that the embodiments are examples of the invention only and that the invention is not intended to be limited to these embodiments. Many other embodiments and variations of the invention may be envisioned by those skilled in the art to which the invention pertains without departing from the spirit and scope of the invention as defined by the appended claims.

What is claimed is:

1. A data processing system comprising:
a storage medium, and
a controller including a data processing block, configured to receive data from a host, transmit the received data to the storage medium, read data from the storage medium in response to a read request from the host, and decode the read data by the data processing block according to multiple decoding modes,
wherein the data processing block includes a first decoder and a second decoder, and is configured to manage the first decoder and the second decoder to run the decoding for the read data, and activate a fast decoding having shorter latency than a normal decoding after a fast decoding condition is satisfied.

2. The data processing system according to claim 1,
wherein the controller is coupled to the host through a network, and the network is a wireless network.

3. The data processing system according to claim 1, wherein the fast decoding condition is satisfied when a result of a previous decoding includes at least one among whether the previous decoding is a failure, whether the number of error bits corrected in the previous decoding exceeds a threshold number and whether a decoding iteration count in the previous decoding exceeds a threshold iteration count.

4. The data processing system according to claim 3, wherein the previous decoding is the normal decoding.

5. The data processing system according to claim 4, wherein the read data includes data chunks, and
wherein the data processing block performs the previous decoding on a data chunk among the data chunks, and performs the fast decoding on at least one data chunk on which the normal decoding is not yet performed among the data chunks.

* * * * *